United States Patent [19]
Hachisuka et al.

[11] Patent Number: 5,448,512
[45] Date of Patent: Sep. 5, 1995

[54] SEMICONDUCTOR MEMORY DEVICE WITH CONTACT REGION INTERMEDIATE MEMORY CELL AND PERIPHERAL CIRCUIT

[75] Inventors: Atsushi Hachisuka; Kazuhiro Tsukamoto; Mitsuya Kinoshita, all of Hyogo, Japan

[73] Assignee: Mitsubishi Denki Kabushiki Kaisha, Tokyo, Japan

[21] Appl. No.: 44,676

[22] Filed: Apr. 9, 1993

[30] Foreign Application Priority Data

May 25, 1992 [JP] Japan .................... 4-132822
Feb. 1, 1993 [JP] Japan .................... 5-014889

[51] Int. Cl.⁶ .................................... G11C 11/401
[52] U.S. Cl. .................................... 365/149; 365/63; 365/72
[58] Field of Search ................. 365/149, 63, 72

[56] References Cited

U.S. PATENT DOCUMENTS 5,227,855 7/1993 Momose .................... 365/149

FOREIGN PATENT DOCUMENTS 60-2784 1/1985 Japan .
4-755 1/1992 Japan .
4-10651 1/1992 Japan .

OTHER PUBLICATIONS

W. Wakamiya et al, "Novel Stacked Capacitor Cell for 64Mb DRAM", pp. 69-70 1989.
Toru Kaga, et al, "Crown-Shaped Stacked-Capacitor Cell for 1.5-V Operation 64-Mb DRAM's", IEEE Transactions on Electron Devices, vol., 38, No. 2, Feb. 1991, pp. 255-261.
S. Inoue, et al, "A New Stacked Capacitor Cell with Thin Box Structured Storage Node", Extended Abstracts of the 21st Conference on Solid State Devices and Materials, Tokyo, 1989, pp. 141-144.

Primary Examiner—Joseph E. Clawson, Jr.
Attorney, Agent, or Firm—Lowe, Price, LeBlanc & Becker

[57] ABSTRACT

A portion of a cell plate 91 extending upon a field oxide film 107a and a silicon oxide film 123 is referred to as a lower layer interconnection film 109. The lower layer interconnection film 109 has a concave shape. A through hole 95a is formed in a silicon oxide film 93 reaching the bottom of the concave shape lower layer interconnection film 109. The depth of the through hole 95a is greater in comparison with the case where a through hole is formed on an upper face portion 123a of the silicon oxide film 123. Because the depth of through hole 95a is great, the thickness of the tungsten film 101a formed in through hole 95a becomes thicker. This eliminates the problem that all the tungsten film 101a in the through hole 95a, and then a portion of the lower layer interconnection film 109 are overetched. Therefore, electrical connection between the upper layer interconnection layer 103a and the lower layer interconnection layer 109 can be ensured.

13 Claims, 48 Drawing Sheets

SEMICONDUCTOR MEMORY DEVICE WITH CONTACT REGION INTERMEDIATE MEMORY CELL AND PERIPHERAL CIRCUIT

BACKGROUND OF THE INVENTION

1. Field of the Invention

The present invention relates to semiconductor memory devices, and more particularly, to the structure where electrical connection is carried out between an upper interconnection layer and a lower interconnection layer which is a portion of a cell plate, and a method of manufacturing that structure.

2. Description of the Background Art

The demand of semiconductor memory devices is rapidly growing in accordance with the significant spread of information equipment such as computers. Semiconductor memory devices having a large functional storage capacity and that can operate at high speed are required. In response, technical development of semiconductor memory devices regarding increase in integration density and high speed response is carried out.

One type of a semiconductor memory device is a DRAM (Dynamic Random Access Memory) capable of random input/output of information data. A DRAM generally includes a memory cell array which is the storage region for storing a plurality of information signals, and a peripheral circuit required for carrying out input/output with an external source.

FIG. 34 is a block diagram showing a structure of a conventional DRAM. Referring to FIG. 34, a DRAM 1000 includes a memory cell array 1100 for storing a data signal of information, a row and column address buffer 1200 for receiving an externally applied address signal to select a memory cell forming a unit storage circuit, a row decoder 8300 and a column decoder 1400 for specifying a memory cell by decoding an address signal, a sense refresh amplifier 1500 for amplifying and reading out a signal stored in a specified memory cell, a data-in buffer 1600 and a data-out buffer 1700 for data input/output, and a clock generator 1800 for generating a clock signal.

Memory cell array 1100 occupying a large area on a semiconductor chip has a plurality of memory cells arranged in a matrix for storing unit storage information. FIG. 35 is an equivalent circuit diagram of memory cells of 4 bits forming memory cell array 1100. The illustrated memory cell is a so-called one transistor-one capacitor type memory cell formed of one MOS (Metal Oxide Semiconductor) transistor 1900 and one capacitor 2000 connected thereto. This type of memory cell is widely used in a DRAM of large capacity because it facilitates increase of the integration density of a memory cell array due to its simple structure.

A DRAM memory cell can be divided into several types according to the structure of its capacitor. FIG. 36 is a sectional view of a memory cell having a typical stacked-type capacitor, and is shown in Japanese Patent Publication No. 60-2784, for example. Referring to FIG. 36, the memory cell includes one transfer gate transistor and one stacked type capacitor (referred to as "stacked type capacitor" hereinafter).

A transfer gate transistor includes source/drain regions 5a and 5b formed at the main surface of a silicon substrate 1, and a gate electrode (word line) 7 formed on the main surface of silicon substrate 1 between source/drain region 5a and source/drain region 5b. A stacked type capacitor includes a storage node 9 electrically connected to source/drain region 5b and extending upon field oxide film 3, a dielectric film 11 formed at the surface of storage node 9, and a cell plate 13 formed at the surface of dielectric film 11.

An interlayer insulating film 17 is formed to cover the transfer gate transistor and the stacked type capacitor. A bit line 15 is formed on interlayer insulating film 17. A through hole is formed in interlayer insulating film 17. Bit line 15 is electrically connected to source/drain region 5a via this through hole.

A feature of this stacked type capacitor is that the capacitance of a capacitor is ensured by extending the main portion of the capacitor upon the gate electrode and the field oxide film to increase the opposing area between electrodes in the capacitor.

The capacity of a capacitor is generally proportional to the opposing area of electrodes and is inversely proportional to the thickness of the dielectric film. It is preferable to increase the opposing area between electrodes of a capacitor from the standpoint of increasing the capacity of a capacitor. However, the size of a memory cell is significantly reduced in accordance with increase in the integration density of a DRAM. This means that the capacitor formation region has its planar occupying area reduced. The amount of charge stored in a memory cell of 1 bit can not be reduced from the standpoint of stable operation and reliability of a DRAM as a memory device. In order to satisfy these contradicting constraints, various improvements have been proposed for the structure of the capacitor to reduce the planar occupying area of the capacitor and to increase the opposing area between electrodes.

FIG. 37 is a sectional view of a memory cell disclosed in Japanese Patent Laying-Open No. 4-755. A storage node 23 of the capacitor of this memory cell includes a base portion 23a, and a wall portion 23b extending upwards with respect to the main surface of a silicon substrate 21. The capacity of the capacitor can be increased by this wall portion 23b without increasing the planar occupying area of the capacitor.

The structure of this memory cell will be described specifically. On the main surface of silicon substrate 21, source/drain regions 25a, 25b, and 25c are formed spaced apart. Base portion 23a is electrically connected to source/drain region 25c. A dielectric film 27 is formed at the surface of storage node 23. A cell plate 29 is formed at the surface of dielectric film 27.

Gate electrodes 31a and 31b spaced apart are formed above the main surface of silicon substrate 21. Gate electrodes 31a and 31b are covered with an insulating film 33. 35 indicates a field oxide film.

An interlayer insulating film 37 is formed on cell plate 29. Interconnection films 39 are formed spaced apart on interlayer insulating film 37. Interconnection films 39 are covered with a protection film 41. A method of manufacturing this memory cell will be described hereinafter.

Referring to FIG. 38, a field oxide film 35 is formed at the main surface of silicon substrate 21 using a LOCOS method.

Referring to FIG. 39, a gate oxide film 43 is formed by thermal oxidation. Then, gate electrodes 31a, 31b, 31c, 31d of polycrystalline silicon are selectively formed. An insulating film 33 is formed around gate electrodes 31a–31d by two steps of a deposition step of an oxide film and an etching step. Using insulating film 33 as a mask, impurities are implanted to the main surface of silicon substrate 21 by ion implantation to form source/drain regions 25a, 25b, and 25c.

Referring to FIG. 40, a refractory metal film is deposited and patterned to a predetermined configuration. Thus, a bit line 45 electrically connected to source/drain region 25b is formed. An insulating film 47 covers the circumference of bit line 45.

Referring to FIG. 41, a polycrystalline silicon film 49 is formed all over the main surface of silicon substrate 21 by CVD method.

Referring to FIG. 42, an insulating film 51 is formed on polycrystalline silicon film 49.

Referring to FIG. 43, a resist 53 is applied on the surface of insulating film 51 to be subjected to a lithography method to result in a predetermined pattern.

Referring to FIG. 44, insulating film 51 is selectively removed by etching using resist 53 as a mask.

Referring to FIG. 45, a polycrystalline silicon film 55 is formed by CVD after removal of resist 53.

Referring to FIG. 46, a thick resist 57 is applied so that polycrystalline silicon film 55 is completely covered. Then, resist 57 is etched back to expose polycrystalline silicon film 55 covering the upper surface of insulating film 51.

Referring to FIG. 47, the exposed polycrystalline silicon film 55 is etched. Then, insulating layer 51 is removed by etching in a self-alignment manner. Thus, polycrystalline silicon film 55 becomes the wall portion 23b.

Referring to FIG. 48, only the exposed portion of polycrystalline silicon film 49 is removed in a self-alignment manner by anisotropic etching. Thus, polycrystalline silicon film 49 becomes the base portion 23a. Then, resist 57 is removed.

Referring to FIG. 49, a dielectric film 27 of silicon nitride film is formed on the surface of storage node 23.

Referring to FIG. 50, a cell plate 29 of a polycrystalline silicon film is formed all over the main surface of silicon substrate 21.

Referring to FIG. 51, an interlayer insulating film 37 is formed on cell plate 29. An interconnection film 39 of aluminum is formed on interlayer insulating film 37, as shown in FIG. 37, to cover protection film 41. Thus, the manufacture process of a memory cell is completed.

Under the condition shown in FIG. 51, the area other than the memory cell formation region is as shown in FIG. 52. The memory cell formation region is indicated by A. In order to provide electrical connection between cell plate 29 and the upper layer interconnection film, a portion of cell plate 29 extends upon interlayer insulating film 65. This portion of cell plate 29 is referred to as the lower layer interconnection film 30. Gate electrodes 31e and 31f are formed in the memory cell formation region. The MOS transistor is indicated by 63. MOS transistor 63 includes source/drain regions 61a and 61b. Dielectric film 27 of the capacitor is formed all over silicon substrate 21 as shown in FIG. 52. The impurity region is indicated by 59. The method of providing electrical connection between lower layer interconnection film 30 and the upper layer interconnection film will be described hereinafter.

Referring to FIG. 53, a resist 69 is applied on interlayer insulating film 37. A predetermined patterning is applied to resist 69. Interlayer insulating films 37 and 65 are selectively removed by anisotropic etching using resist 69 as a mask to form through holes 67a, 67b, 67c, and 67d.

Referring to FIG. 54, resist 69 is removed. Using a CVD method, a tungsten film 71 is formed on interlayer insulating film 37. The CVD method is used because a through hole can not be completely filled by sputtering if the aspect ratio of the through hole (depth of the hole/opening dimension of the hole) is increased. Tungsten film 71 is formed also inside the through hole to provide electrical connection with lower layer interconnection film 30, impurity region 59, and source/drain regions 61a and 61b.

Tungsten film 71 is etched all over using pseudo anisotropic etching where the ratio of anisotropy to isotropy is 2:1. Then, tungsten film 71 is removed leaving tungsten within through holes 67a, 67b, 67c, and 67d. Pseudo anisotropic etching is used to ensure that no tungsten remains at the stepped portion (not shown) of interlayer insulating film 37. Because the thickness of tungsten film 71 can not be formed in uniform and the etching rate differs depending upon the position on the semiconductor device arranged on the wafer, there are cases where tungsten film 71a still remains in other areas even when tungsten film 71 on interlayer insulating film 37 is removed as shown in FIG. 55.

Tungsten film 71 is further etched to remove tungsten film 71a remaining on interlayer insulating film 37. This will cause a portion of tungsten film 71 in through hole 67b to be etched away. In through hole 67a which is shallow in depth, tungsten film 71 will be completely etched away with a portion of the lower interconnection film 30 also etched. FIG. 57 shows the state where an aluminum film is formed on interlayer insulating film 37 by sputtering which is subjected to a predetermined patterning. It is appreciated from FIG. 57 that the electrical connection between lower layer interconnection film 30 and interconnection film 39 formed in through hole 67a is defective.

SUMMARY OF THE INVENTION

For solving such conventional problems, an object of the present invention is to provide a semiconductor memory device having reliable electrical connection between an upper interconnection layer and a lower interconnection layer which is a portion of the cell plate.

Another object of the present invention is to provide a method of manufacturing a semiconductor memory device that can have reliable electrical connection between an upper interconnection layer and a lower interconnection layer which is the portion of a cell plate.

An aspect of the present invention is a structure of a semiconductor memory device. According to an aspect of the present invention, a semiconductor memory device includes a memory cell formation region in which a memory cell is formed, including a semiconductor substrate having a main surface, an impurity region formed at the main surface, a storage node formed to connect electrically the impurity region and having a portion extending upwards with respect to the main surface, a dielectric layer formed on the surface of the storage node, a cell plate formed on the surface of the dielectric layer. The semiconductor memory device further includes a first interlayer insulating layer formed on the main surface and at a position distant from the memory cell formation region, a lower layer interconnection layer formed between the memory cell formation region and the first layer interlayer insulating layer and below the upper face portion of the interlayer insulating layer and which is a portion of the cell plate, a second interlayer insulating layer formed between the memory cell formation region and the first interlayer insulating layer having a through hole exposing the lower layer interconnection layer, and an upper layer interconnection layer formed on the second interlayer insulating layer and electrically connected to the lower layer interconnection layer via a through hole.

Another aspect of the present invention is a method of manufacturing a semiconductor memory device. According to this aspect of the present invention, a method of manufacturing a semiconductor memory device includes the steps of forming a first interlayer insulating layer on the main surface of a semiconductor substrate having a memory cell formation region at the main surface, and at a position distant from the memory cell formation region, forming a storage node on the memory cell formation region and having a portion extending upwards with respect to the main surface, forming a dielectric layer on the surface of the storage node, forming a cell plate on the surface of the dielectric layer, forming a lower layer interconnection layer between the memory cell formation region and the first interconnection insulating layer, and at a position below than the upper face portion of the first interlayer insulating layer, and which is a portion of the cell plate, forming a second layer insulating layer on the main surface, forming a through hole in a region between the memory cell formation region and the first interlayer insulating layer and reaching to the lower layer interconnection layer by selectively etching the second interlayer insulating layer, forming a conductive layer on the second interlayer insulating film to fill the through hole, removing the conductive layer by etching leaving the conductive layer in the through hole, and forming an upper layer interconnection layer on the second interlayer insulating layer and electrically connected to the conductive layer in the through hole.

By providing electrical connection between the lower interconnection layer which is a portion of the cell plate and the upper interconnection layer, the cell plate is electrically connected to the upper layer interconnection layer.

According to the said one aspect of the present invention, the lower interconnection layer is between the memory cell formation region and the first interlayer insulating layer, and is below the upper face portion of the first interlayer insulating layer. The through hole used for providing electrical connection between the lower layer interconnection layer and the upper layer interconnection layer is formed between the memory cell formation region and the first interlayer insulating layer. Therefore, the depth of the through hole can be made deeper in comparison with the case where a through hole is formed on the first interlayer insulating layer. Because the depth of the through hole is greater, the thickness of the conductive layer formed in the through hole is increased. Therefore, the problem of the conductive layer in the through hole completely removed during overetching and the lower layer interconnection layer etched away will be eliminated. Therefore, electrical connection between the upper layer interconnection layer and the lower layer interconnection layer can be provided without defect.

According to the said another aspect of the present invention, the lower layer interconnection layer which is a portion of the cell plate is at a region between the memory cell formation region and the first interconnection insulating layer, and is formed below the upper face portion of the first interlayer insulating layer. The second interlayer insulating layer formed on the main surface of the semiconductor substrate is selectively removed by etching to form a through hole between the memory cell formation region and the first interlayer insulating layer and reaching to the lower layer interconnection layer. Therefore, the depth of the through hole is greater in comparison with the case where a through hole is formed on the first interlayer insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
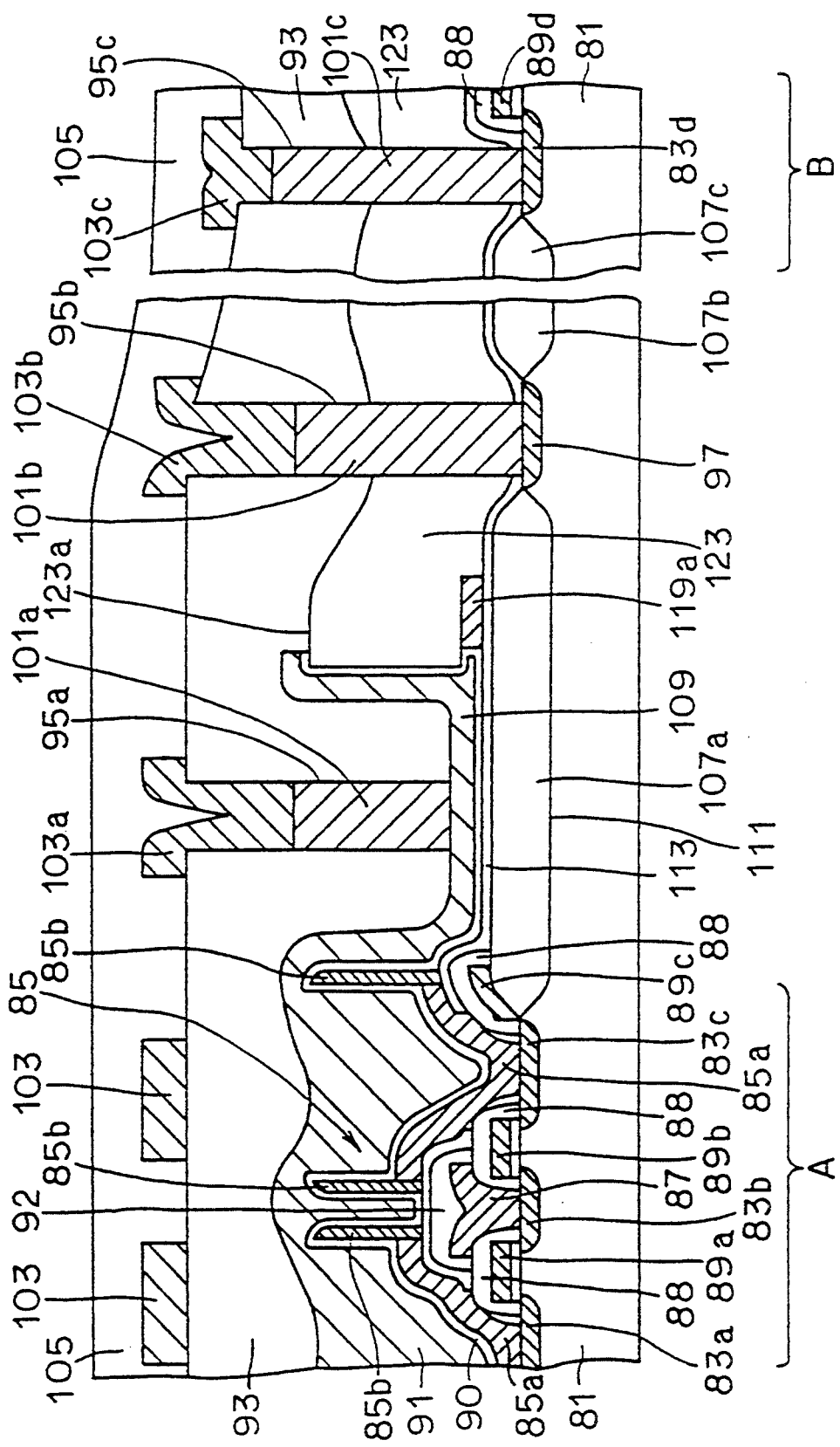
FIGS. 1-26 are sectional views of a semiconductor memory device indicating the processing steps of a manufacturing method according to a first embodiment of the present invention.

FIG. 1 is a sectional view of a semiconductor memory device according to a first embodiment of the present invention. The memory cell formation region is indicated by A. A peripheral circuit formation region distant from the memory cell formation region is indicated by B. First the memory cell formation region will be described.

On a silicon substrate 81, source/drain regions 83a, 83b, 83c are formed spaced apart. Gate electrodes (word lines) are indicated by 89a and 89b. Gate electrodes 89a and 89b are covered with an insulating film 88. A bit line 87 is electrically connected to source/drain region 83b. Bit line 87 is covered with an insulating film 92.

A base portion 85a of storage node 85 is electrically connected to source/drain region 83c. A wall portion 85b is electrically connected to the base portion 85a. A dielectric film 90 is formed at the surface of storage node 85. A cell plate 91 is formed at the surface of dielectric film 90. The word line is indicated by 89c.

A portion of cell plate 91 is formed extending upon a field oxide film 107a and upon the upper face portion 123a of a silicon oxide film 123 which is the first interlayer insulating film. The region of cell plate 91 formed on field oxide film 107a and on silicon oxide film 123 is called the lower layer insulating film 109. Lower layer interconnection film 109 forms a concave shape by a wall portion 85b and a silicon oxide film 123.

Silicon oxide film 93 which is the second interlayer insulating layer is formed on cell plate 91 and on lower layer interconnection film 109. A through hole 95 is formed in silicon oxide film 93 reaching to a portion of lower layer interconnection film 109 which is nearest to the main surface 111 of silicon substrate 81. In other words, through hole 95a reaches the bottom of the concave shape lower layer interconnection film 109. The depth of through hole 95a is at least 5000 Å. Through hole 95a is filled with tungsten film 101a halfway, and the remainder is filled with upper layer insulating film 103a of aluminum. 103 is an upper layer interconnection film of aluminum.

An impurity region 97 is formed in the silicon substrate 81 between field oxide film 107a and field oxide film 107b. A through hole 95b reaching impurity region 97 is formed in silicon oxide films 93 and 123. Through hole 95b is partially filled with tungsten film 101b and the remainder is filled with upper layer insulating film 103b of aluminum. Upper layer interconnection films 103, 103a and 103b are covered with a protection film 105.

The peripheral circuit formation region indicated by B will be described hereinafter. 83d indicates one of the source/drain regions of the MOS transistor. Gate electrode 89d is covered with an insulating film 88. A through hole 95c reaching source/drain region 83d is formed in silicon oxide films 93 and 123. Through hole 95c is filled with tungsten film 101c. Upper layer interconnection film 103c of aluminum is electrically connected to tungsten film 101c. Upper layer interconnection film 103c is covered with protection film 105b.

A method of manufacturing a semiconductor device according to a first embodiment of the present invention will be described hereinafter.

Figure 2:
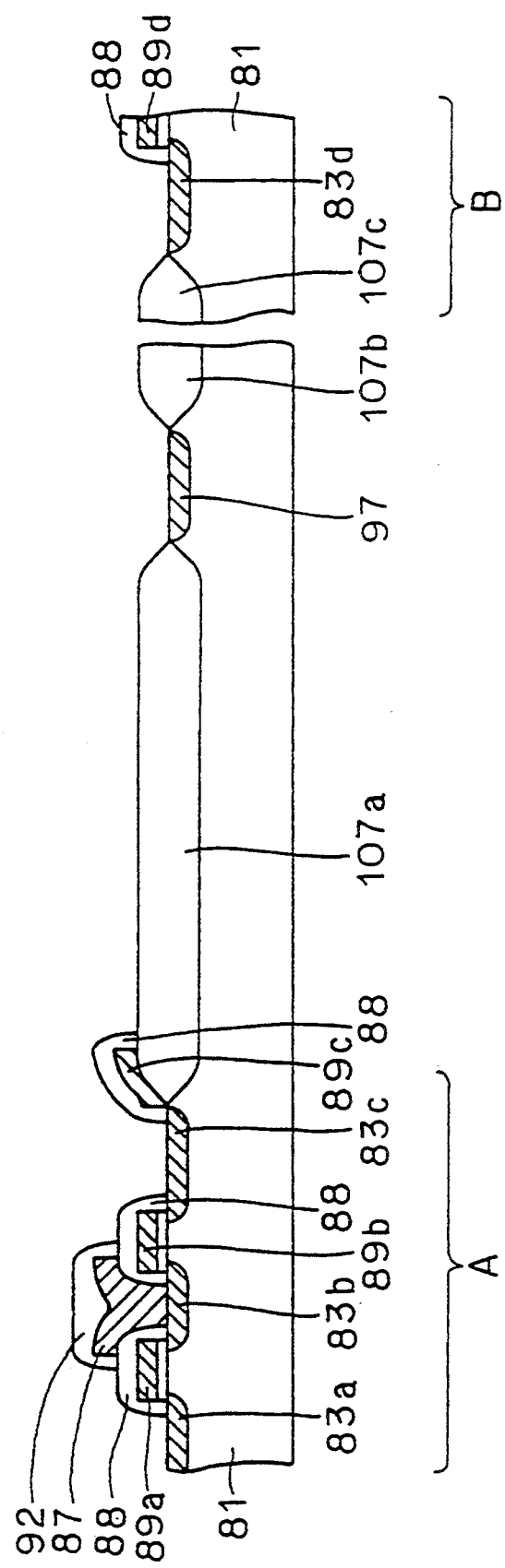

Referring to FIG. 2, gate electrodes (word lines) 89i a, 89b, word line 89c and gate electrode 89d are formed by a conventional method. The gate electrodes and the word line are covered with insulating film 88 of silicon oxide film. Using insulating film 88 as a mask, ions are implanted into silicon substrate 81 to form source/drain regions 83a, 83b, 83c and 83d and impurity region 97. Then, bit line 87 providing electrical connection to source/drain region 83b is formed. Bit line 87 is covered with insulating film 92 of silicon oxide film.

Figure 3:
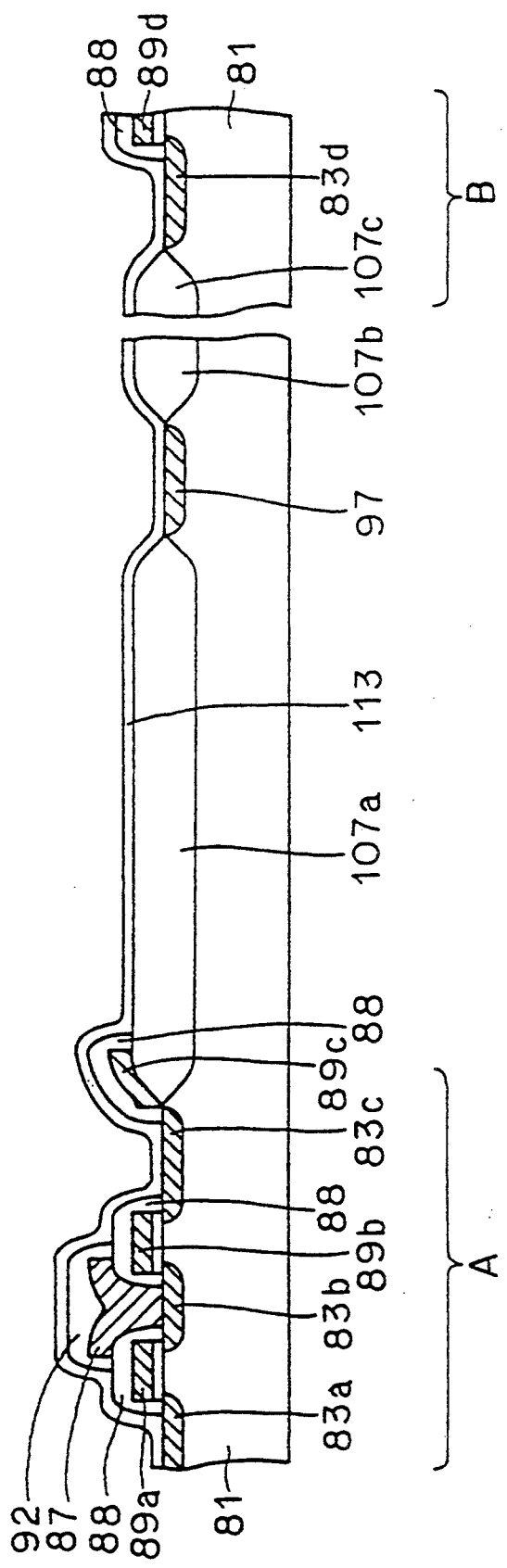

Referring to FIG. 3, silicon nitride film 113 is formed by CVD all over the main surface of silicon substrate 81. A layered structure of a silicon nitride film on a silicon oxide film may be used instead of the silicon nitride film.

Figure 4:
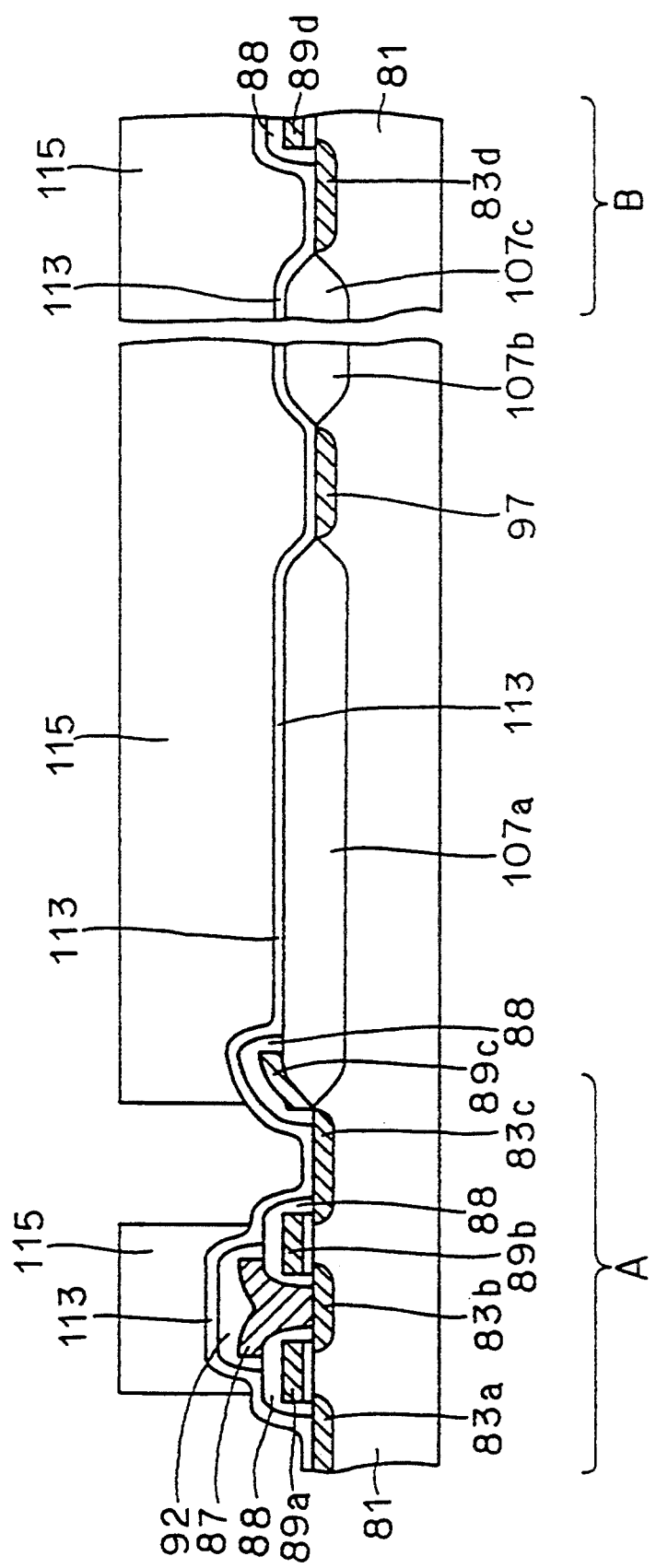

Referring to FIG. 4, resist 115 is applied all over the main surface of silicon substrate 81. Resist 115 is selectively exposed to selectively remove resist 115 on source/drain regions 83a and 83c.

Figure 5:
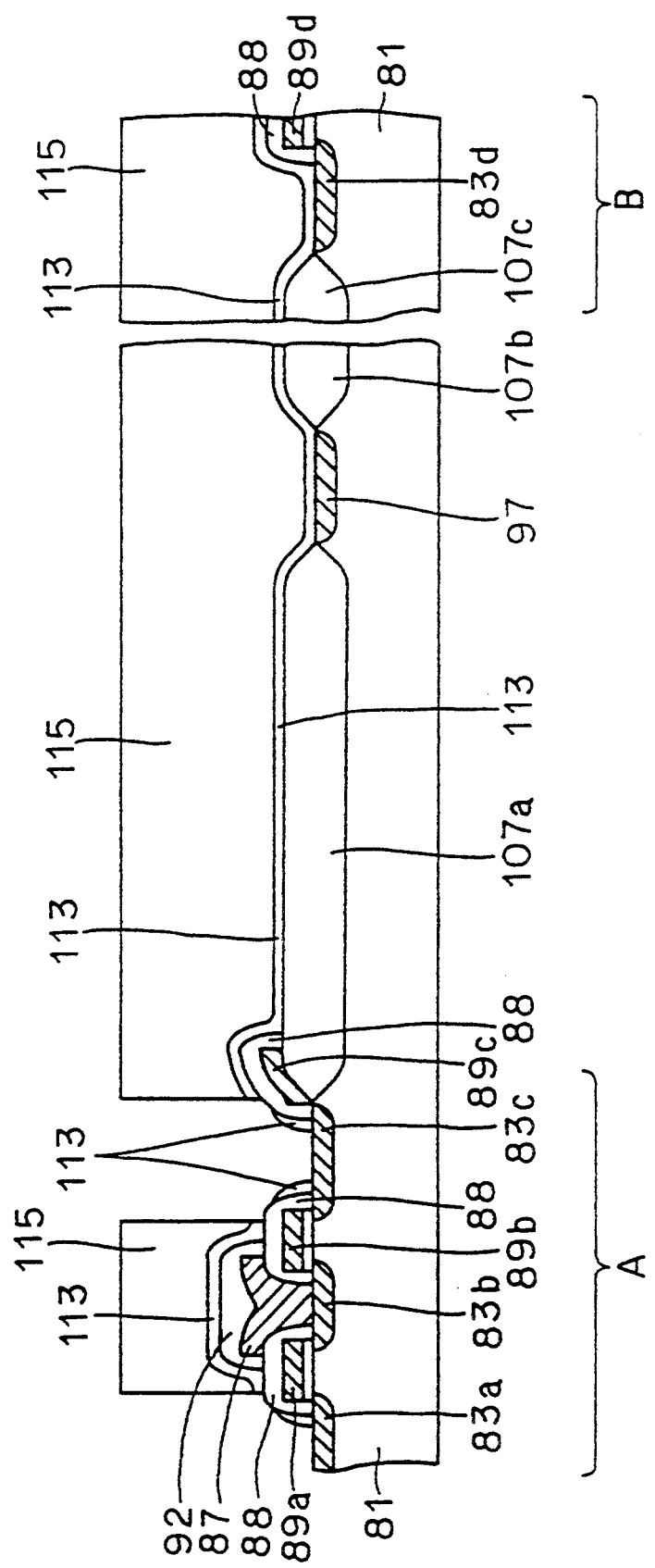

Referring to FIG. 5, silicon nitride film 113 is selectively removed by etching using resist 115 as a mask by reactive ion etching. Because of anisotropic etching, silicon nitride film 113 remains on the sidewall of insulating film 88.

Figure 6:
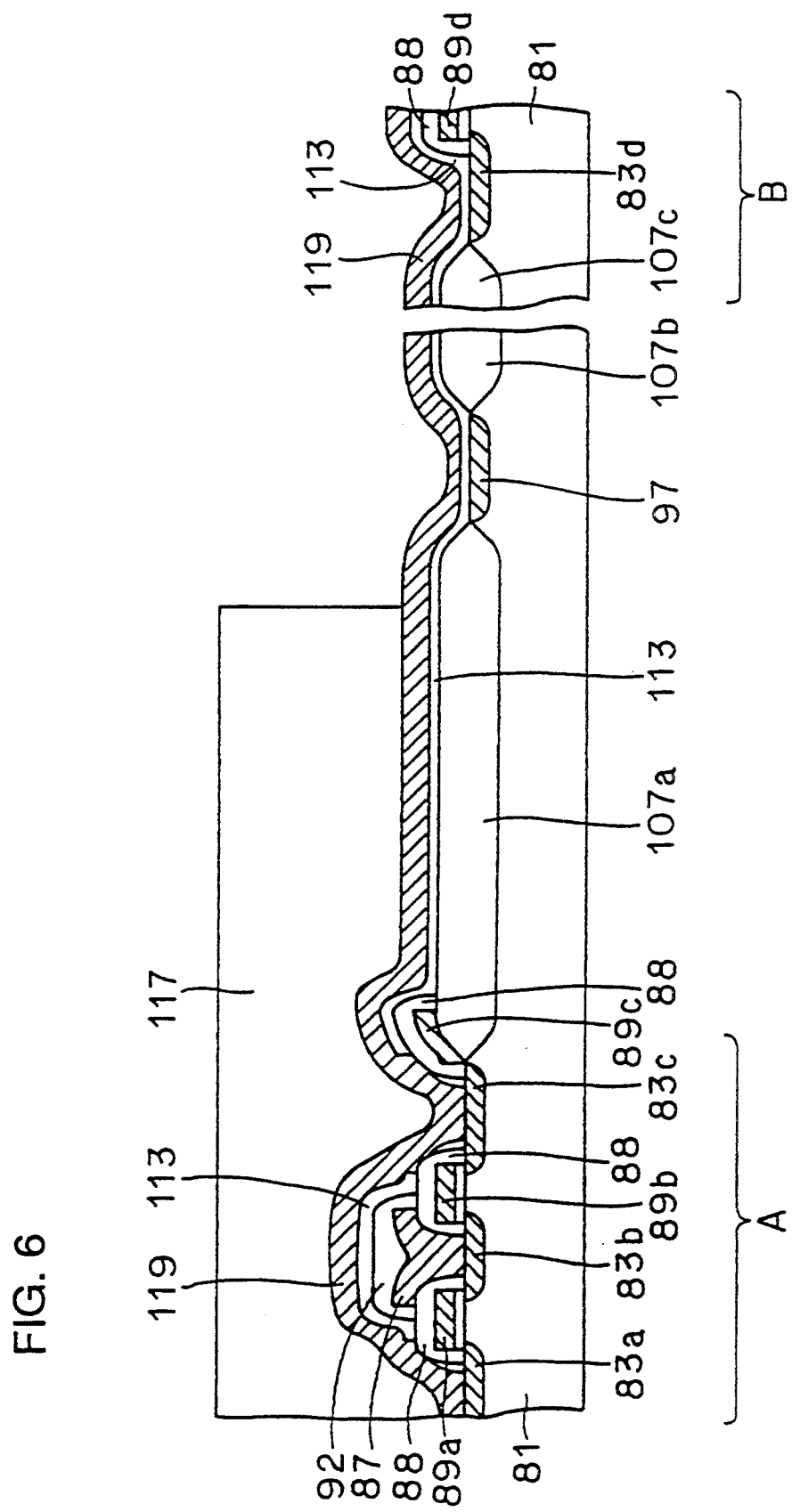

Referring to FIG. 6, polycrystalline silicon film 119 is formed all over the main surface of silicon substrate 81 by CVD. Silicon oxide film 117 is formed on polycrystalline silicon film 119 using the CVD method. Using conventional photolithography and etching techniques, silicon oxide film 117 is removed leaving only the silicon oxide film 117 on the memory cell formation region.

Figure 7:
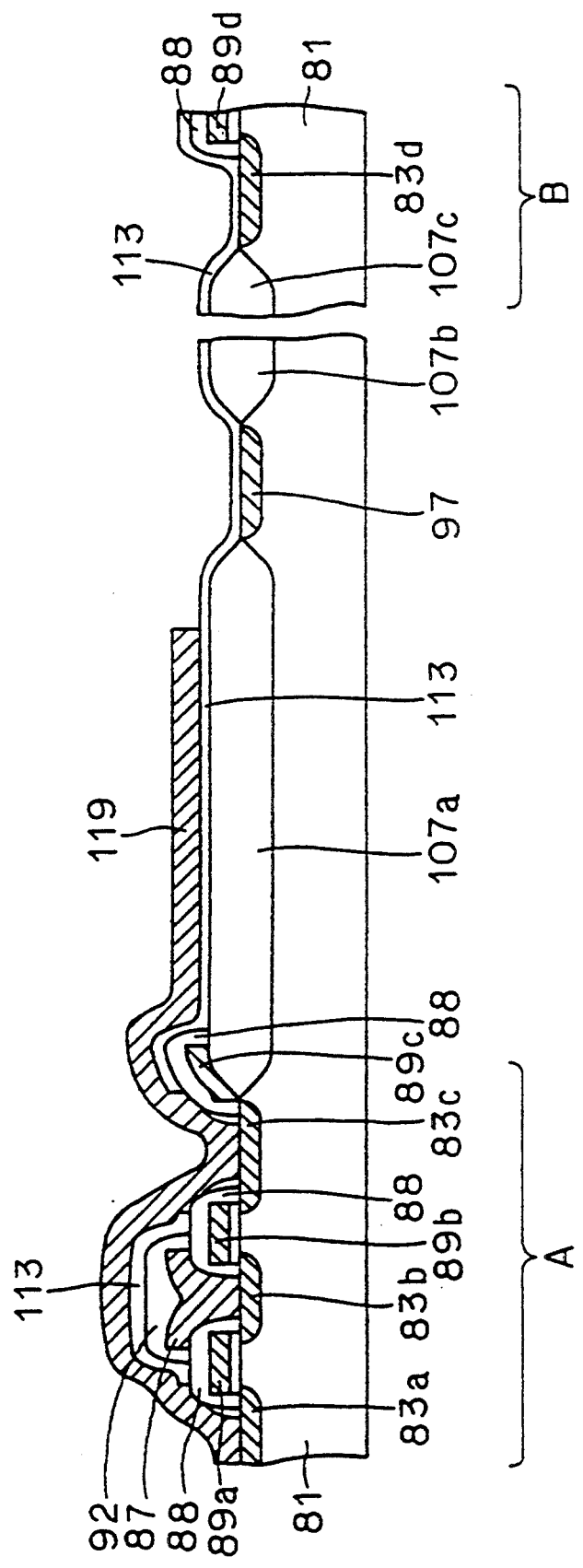

Referring to FIG. 7, polycrystalline silicon film 119 is removed by etching using silicon oxide film 117 as a mask. Then silicon oxide film 117 is removed. Here, a resist may be provided instead of silicon oxide film 117 to carry out etching of polycrystalline silicon film 119 using this as a mask. This is shown in FIG. 7. The etching of impurity region 97 and source/drain region 83d is prevented during the etching process of polycrystalline silicon film 119 owing to silicon nitride film 113.

Figure 8:
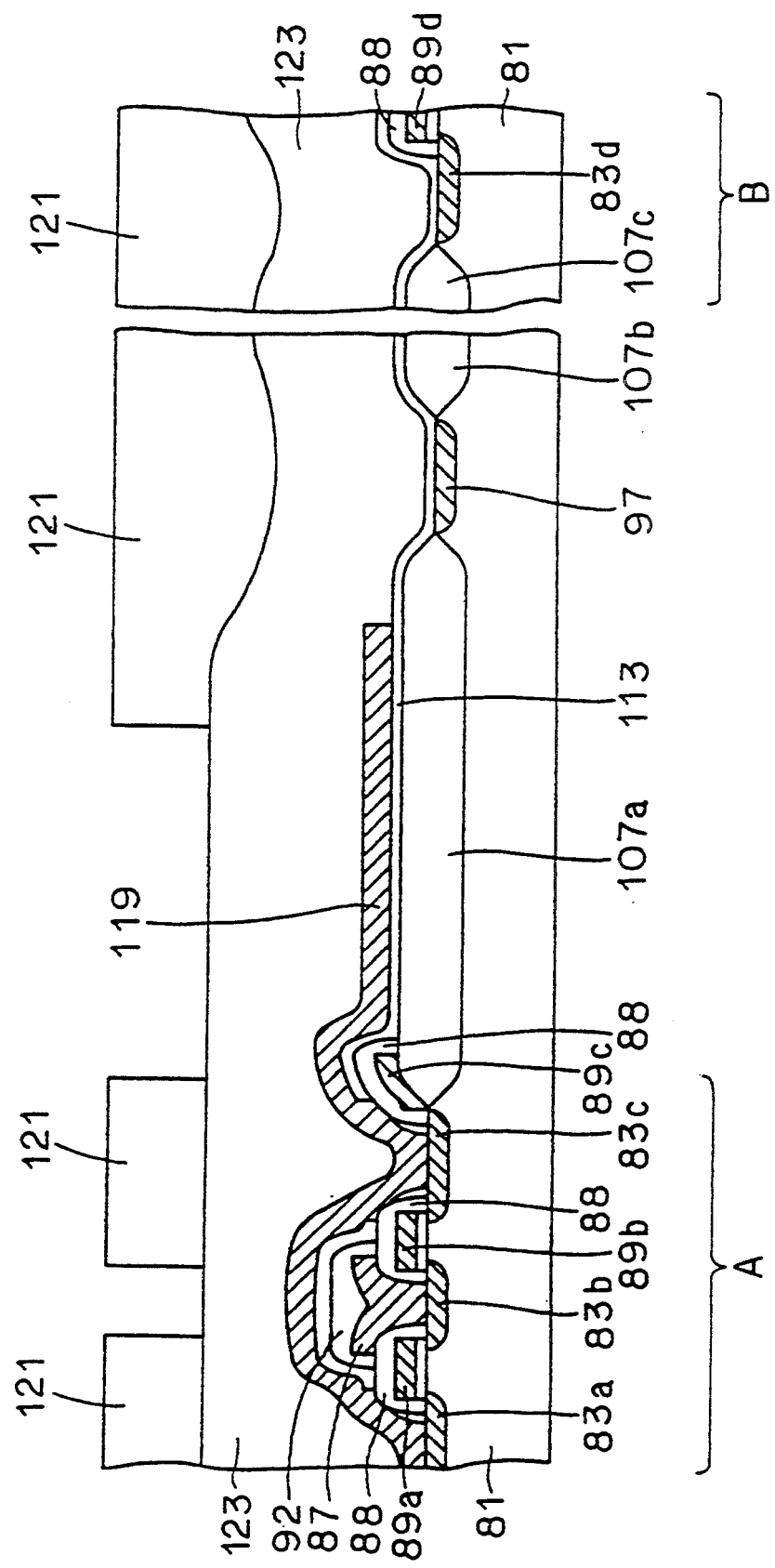

Referring to FIG. 8, silicon oxide film 123 using CVD is formed all over the main surface of silicon substrate 81. Resist 121 is applied on silicon oxide film 123. Resist 123 is subjected to a predetermined patterning.

Figure 9:
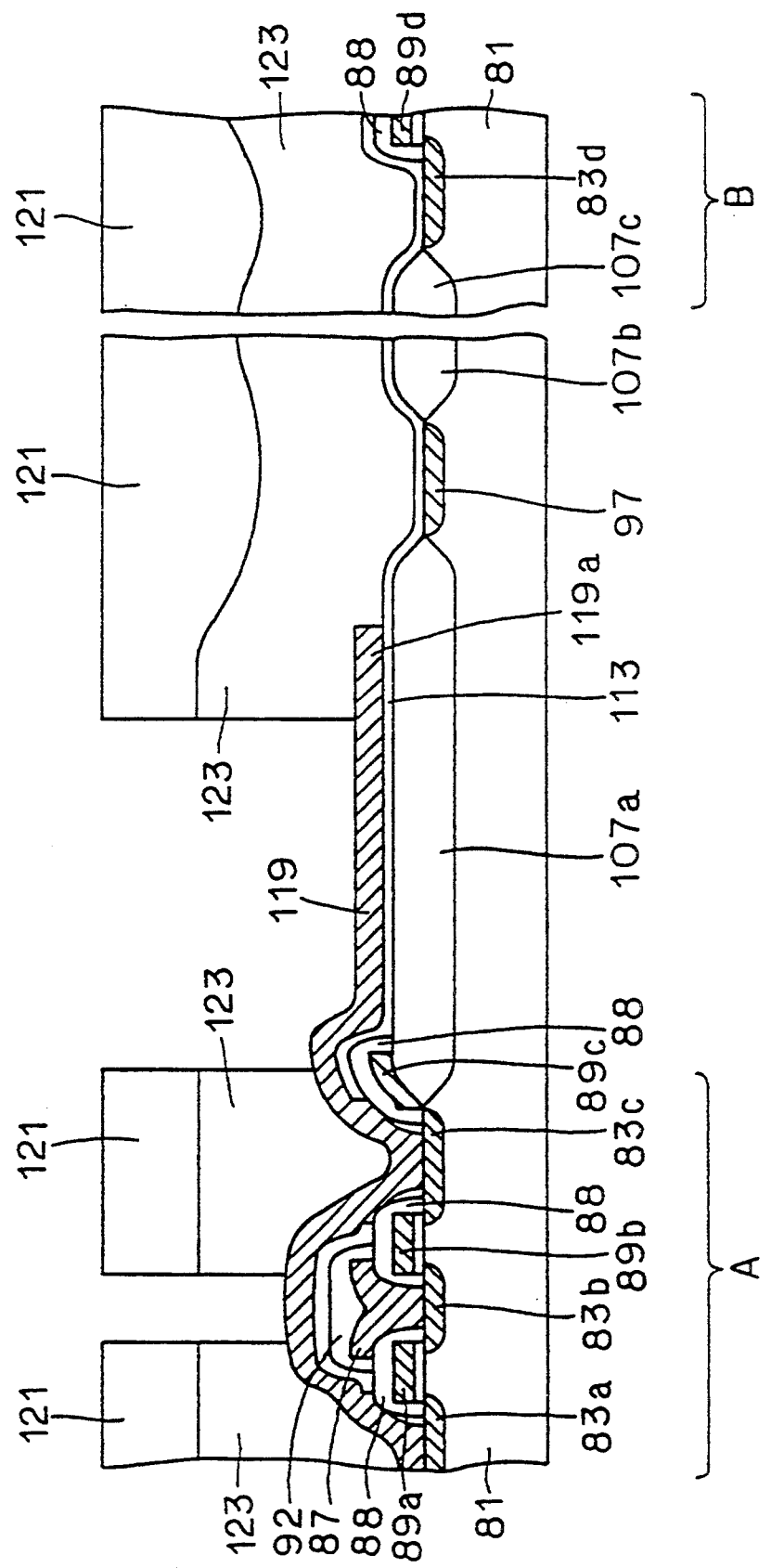

Referring to FIG. 9, silicon oxide film 123 on bit line 87 and on field oxide film 107a are selectively removed by etching using resist 121 as a mask. Polycrystalline silicon film 119 on field oxide film 107a prevents field oxide film 107a from being etched. Because the difference in the etching rates between silicon nitride film 113 and silicon oxide film 123 is small, silicon nitride film 113 does not serve as an etching stopper. Therefore, polycrystalline silicon film 119 is established as an etching stopper. Thus, silicon oxide film 123 has a structure which extends on the end portion 119a of polycrystalline silicon film 119.

Figure 10:
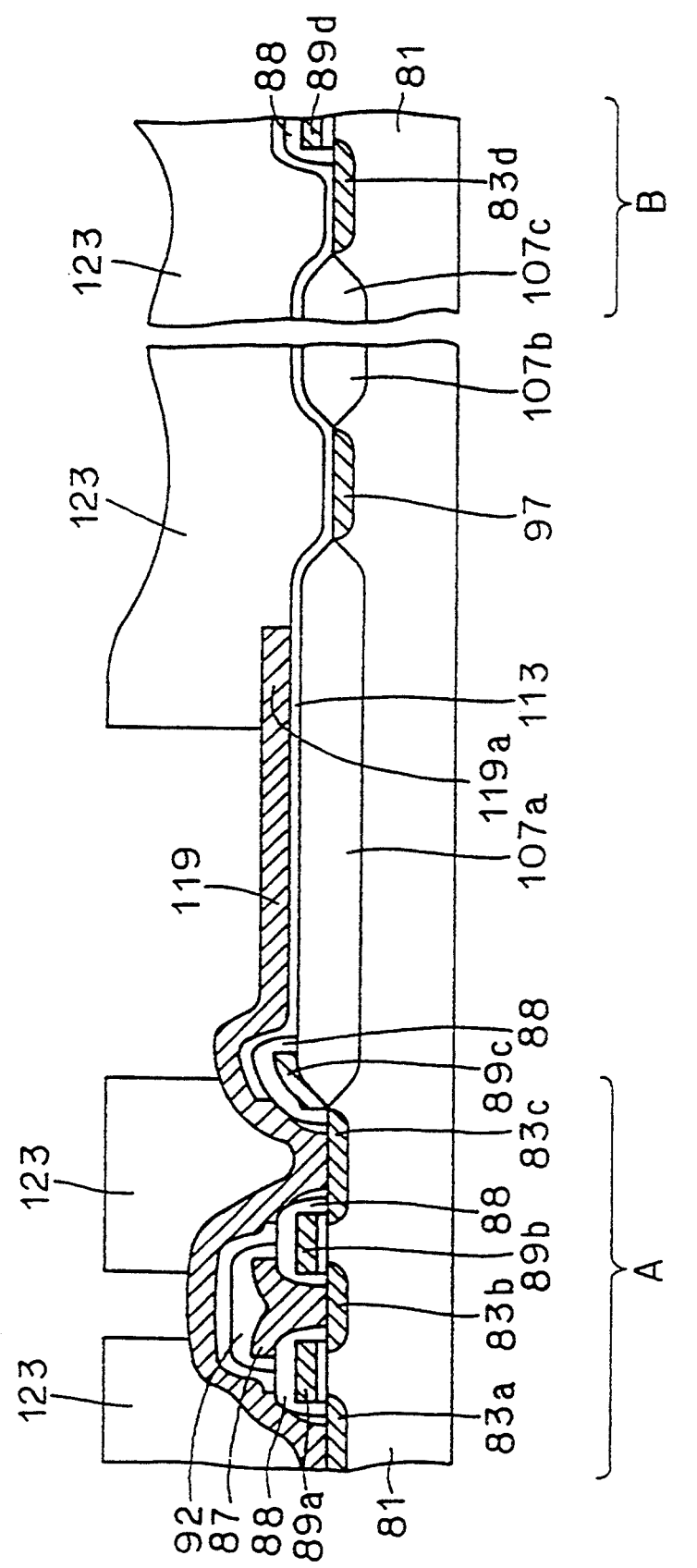

Referring to FIG. 10, resist 121 is removed.

Figure 11:
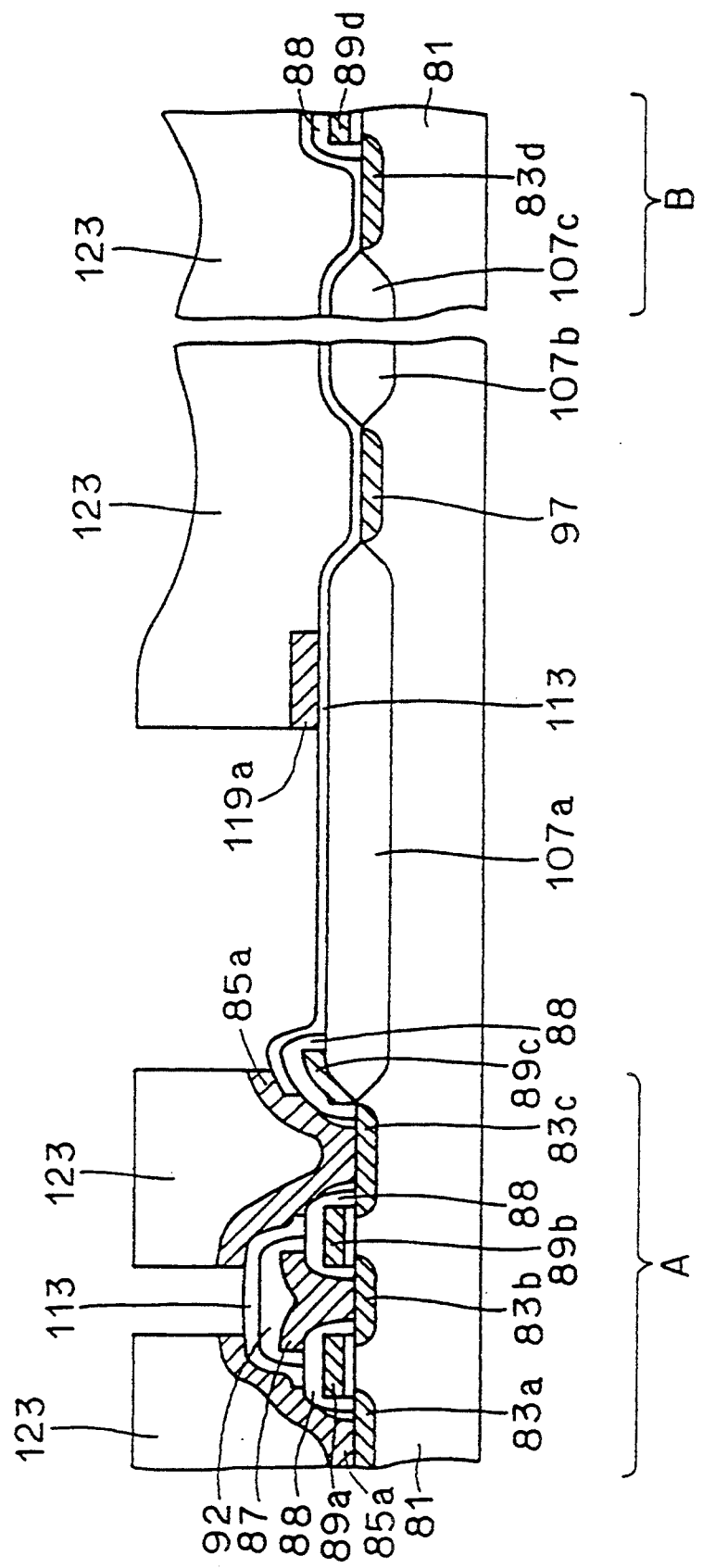

Referring to FIG. 11, a polycrystalline silicon film 119 is selectively removed by etching using silicon oxide film 123 as a mask. The polycrystalline silicon film 119 electrically connected to source/drain regions 83a and 83c is referred to as the base portion 85a hereinafter. Silicon oxide film 123 is formed for the purpose of reducing the difference in the level between the memory cell formation region and other regions, it also serves as a mask in etching polycrystalline silicon film 119.

Figure 12:
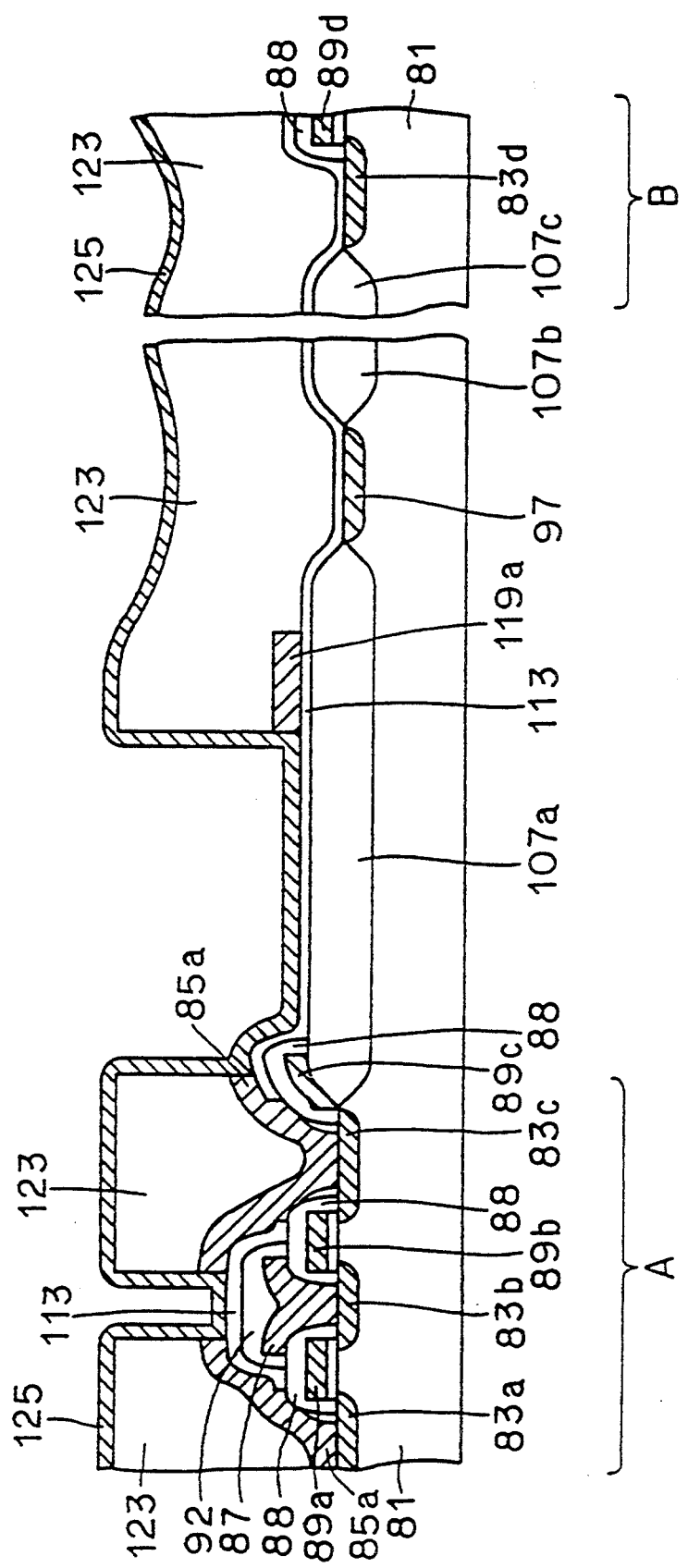

Referring to FIG. 12, polycrystalline silicon film 125 is formed all over the main surface of silicon substrate 81 by CVD.

Figure 13:
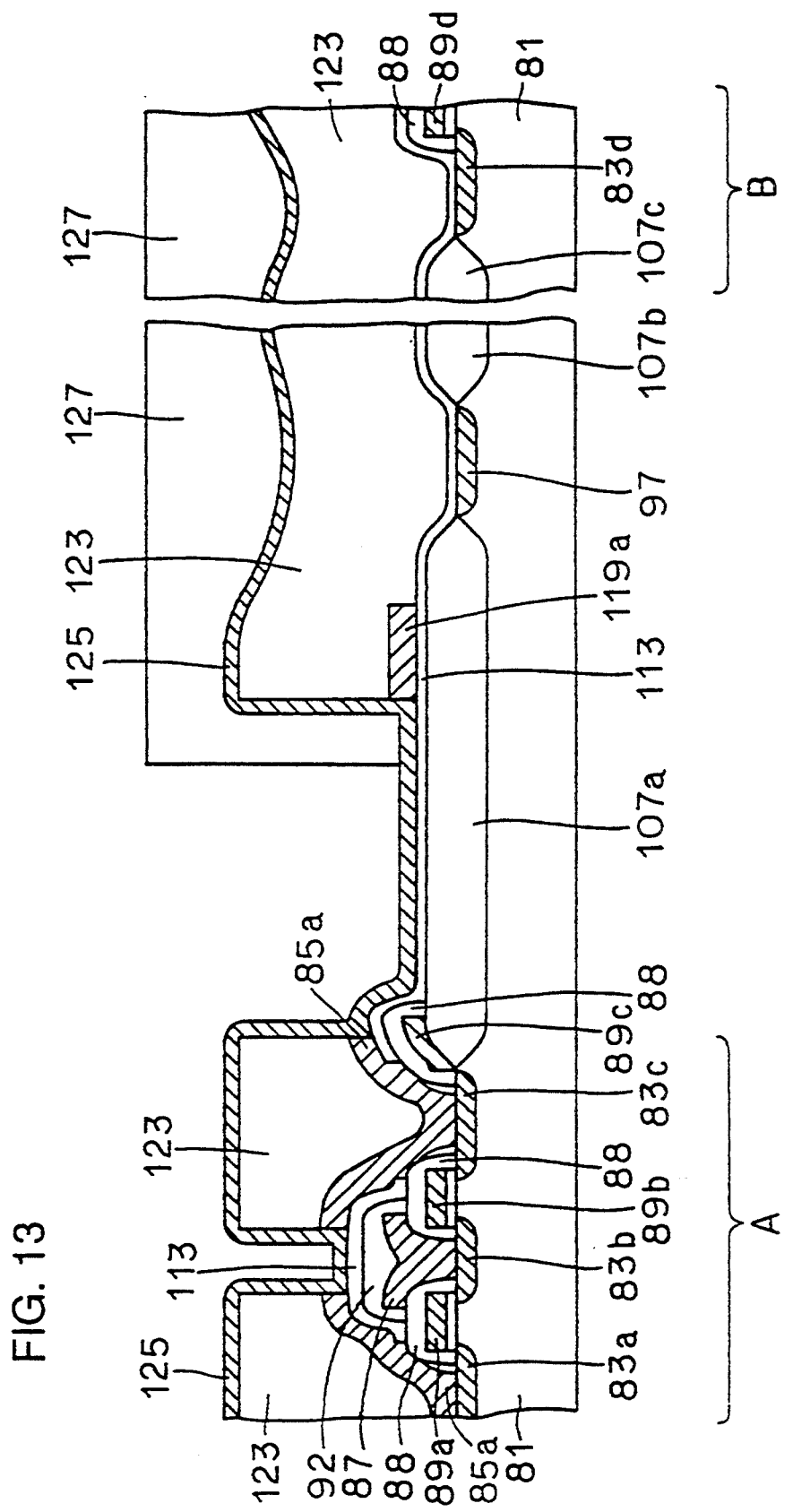

Referring to FIG. 13, resist 127 is applied all over the main surface of silicon substrate 81. Then, resist 127 on the memory cell formation region is removed.

Figure 14:
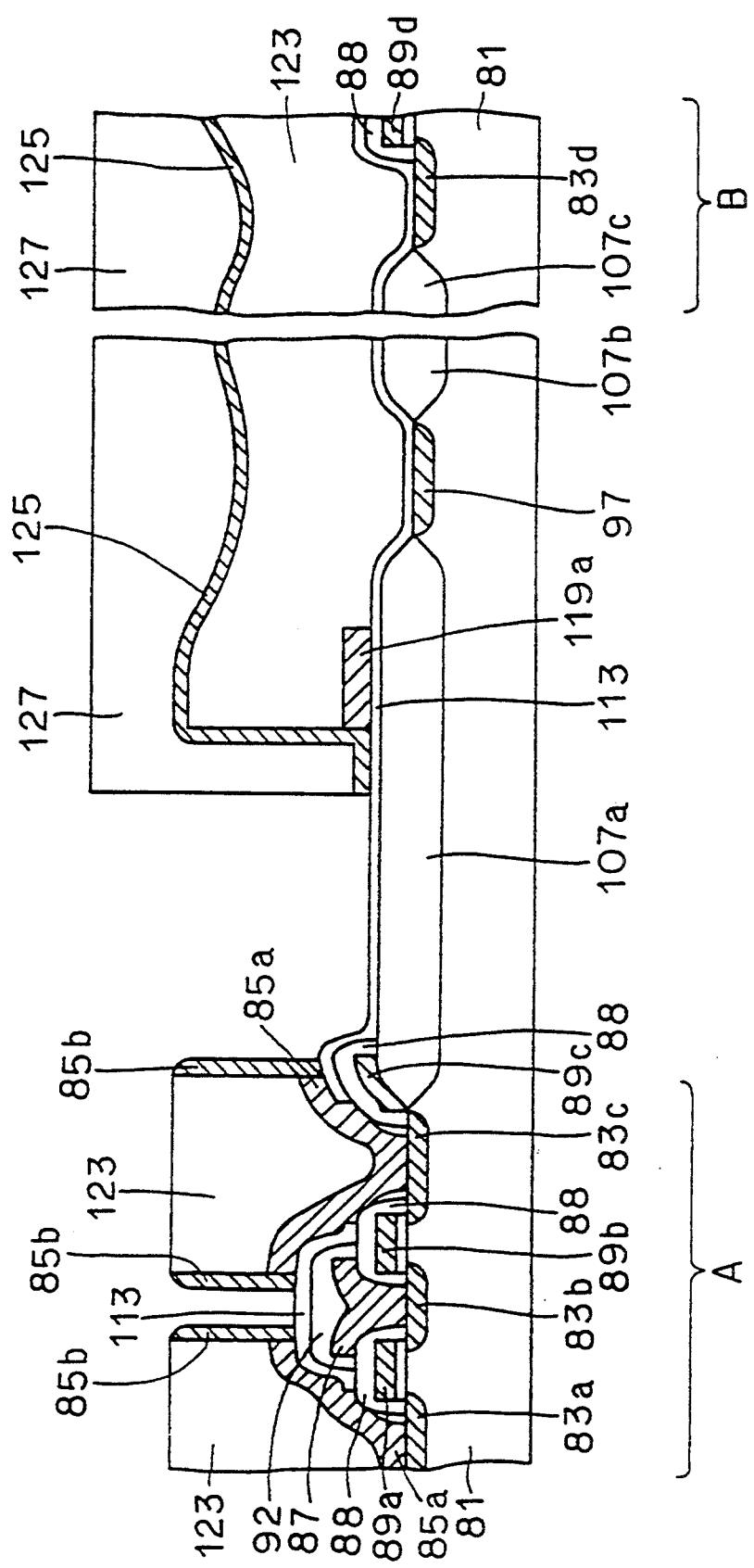

Referring to FIG. 14, polycrystalline silicon film 125 is selectively removed by etching using resist 127 as a mask by reactive ion etching. As a result, polycrystalline silicon film 125 on field oxide film 107a, on silicon oxide film 123, and on bit line 87 is removed. Because anisotropic etching is used, polycrystalline silicon film 125 formed at the sidewall of silicon oxide film 123 is not removed. The polycrystalline silicon film 125 remaining at the sidewall of silicon oxide film 123 is called the wall portion 85b hereinafter.

Figure 15:
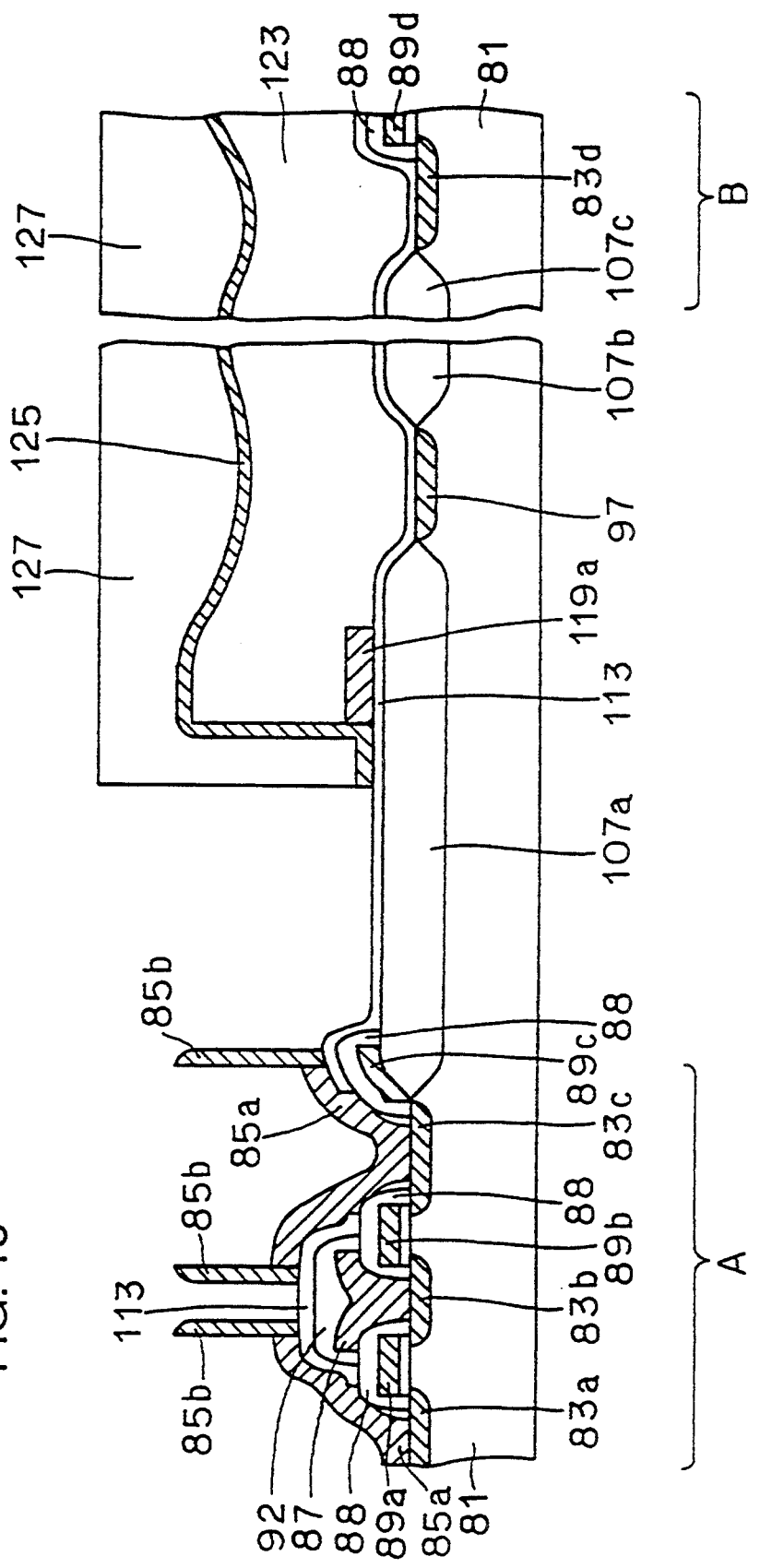

Referring to FIG. 15, silicon oxide film 123 is etched in a self-alignment manner. Then, resist 127 is removed.

Figure 16:
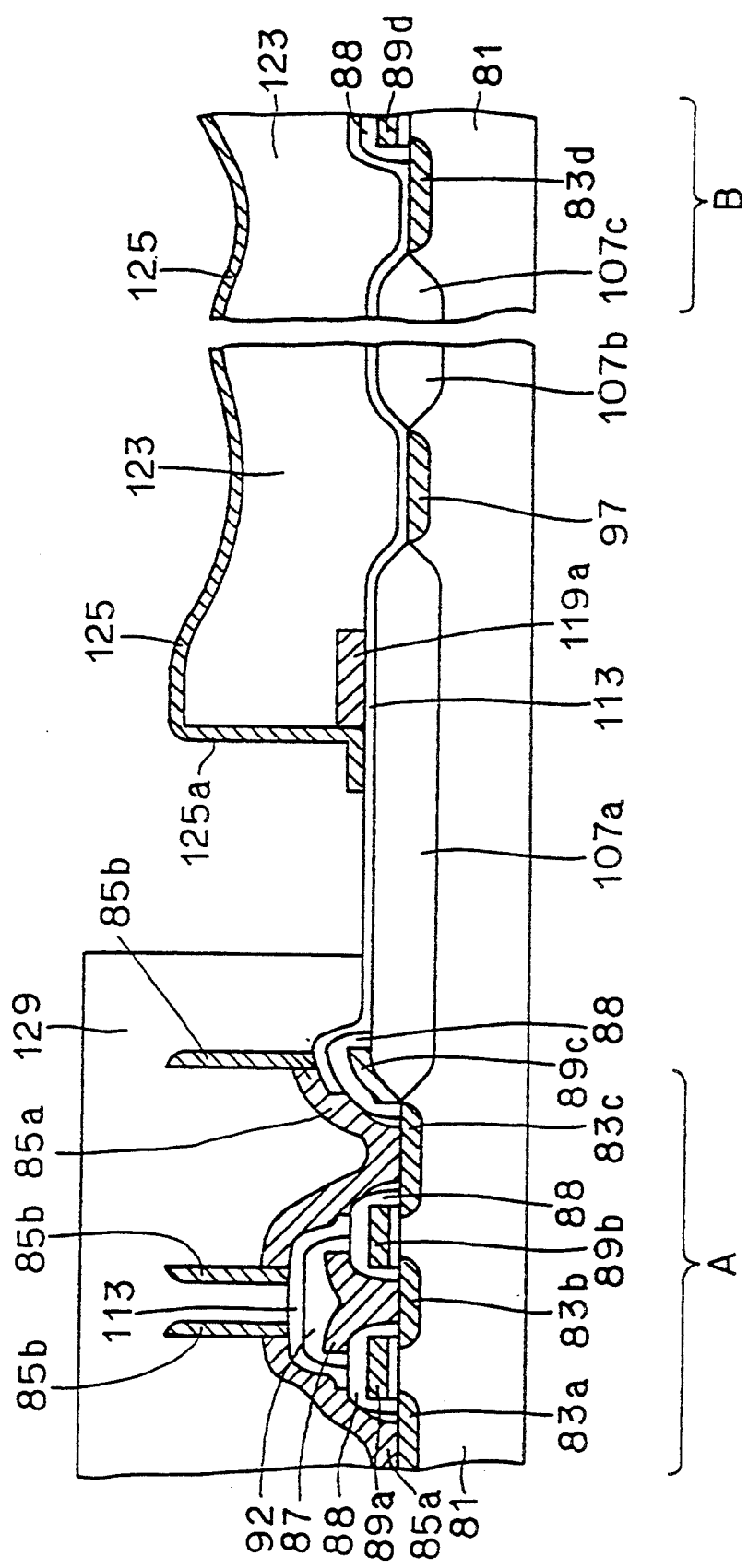

Referring to FIG. 16, resist 129 is applied all over the main surface of silicon substrate 81. Leaving resist 129 on the memory cell formation region, resist 129 on other regions is removed.

Figure 17:
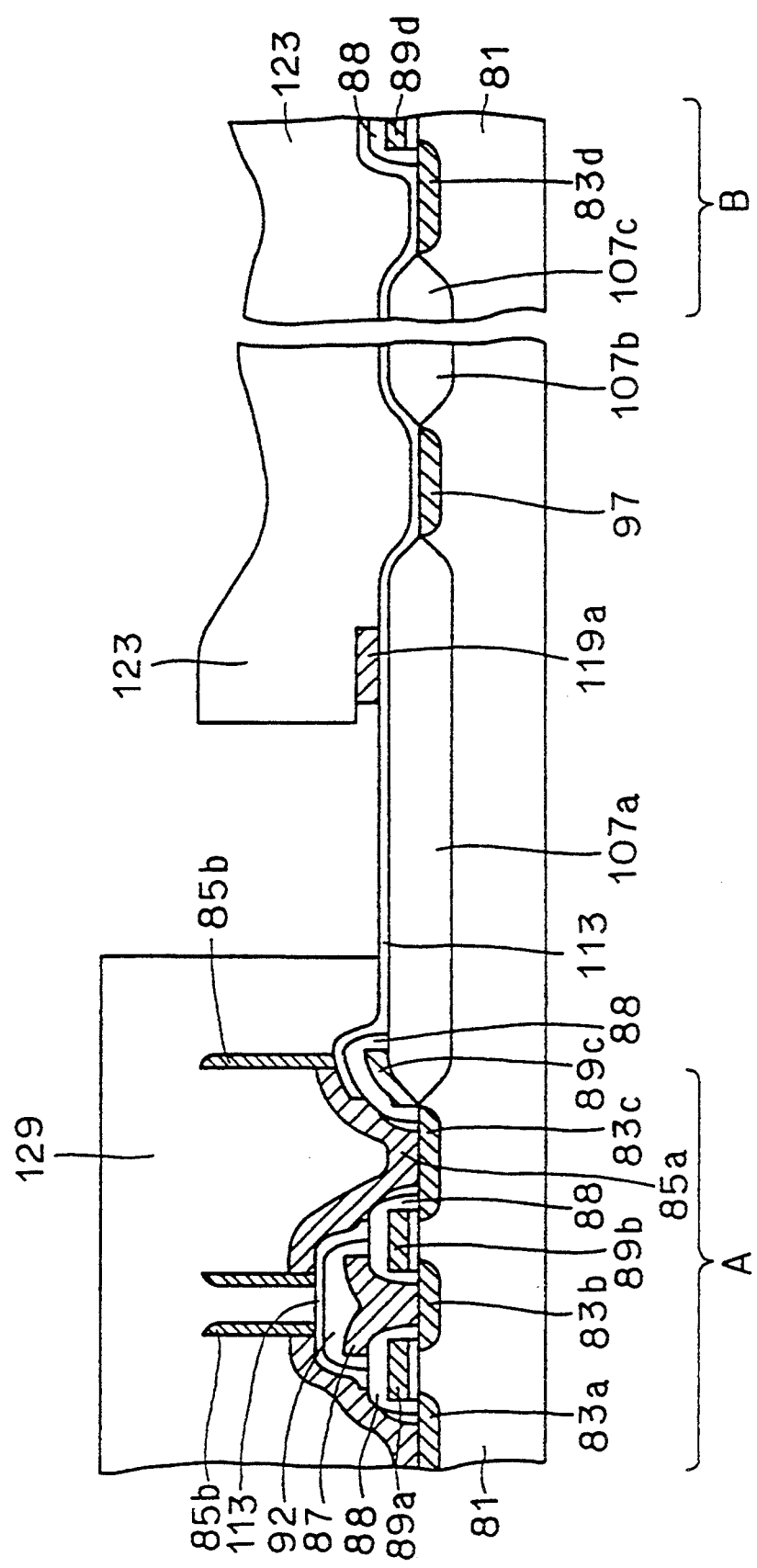

Referring to FIG. 17, polycrystalline silicon film 125 is removed by etching using resist 129 as a mask. This etching for removing polycrystalline silicon 125a formed at the sidewall of silicon oxide film 123 utilizes the pseudo anisotropic etching, as shown in FIG. 16. Polycrystalline silicon film 119a is partially etched as shown in FIG. 17. Because polycrystalline silicon film 119a is not required, the isotropic element may be enhanced to completely etch it away.

Figure 18:
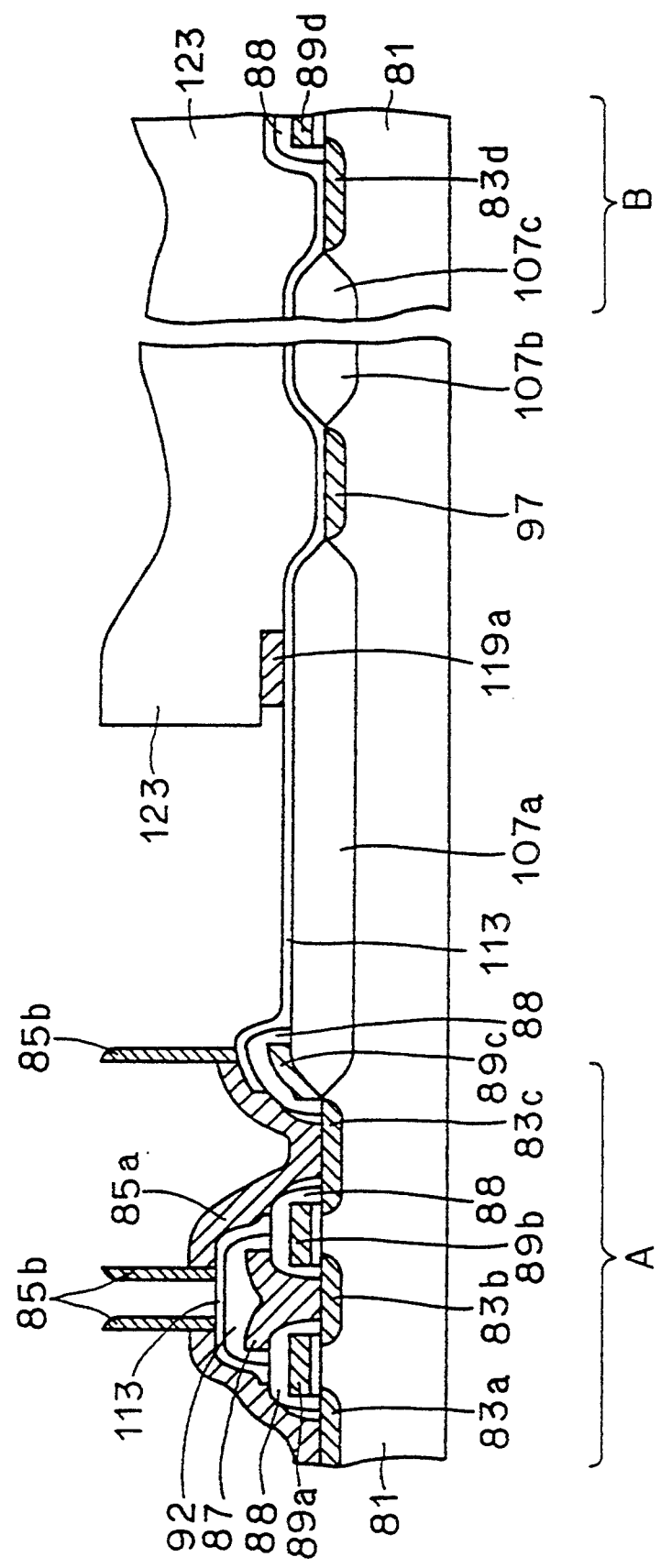

Referring to FIG. 18, resist 129 is removed.

Figure 19:
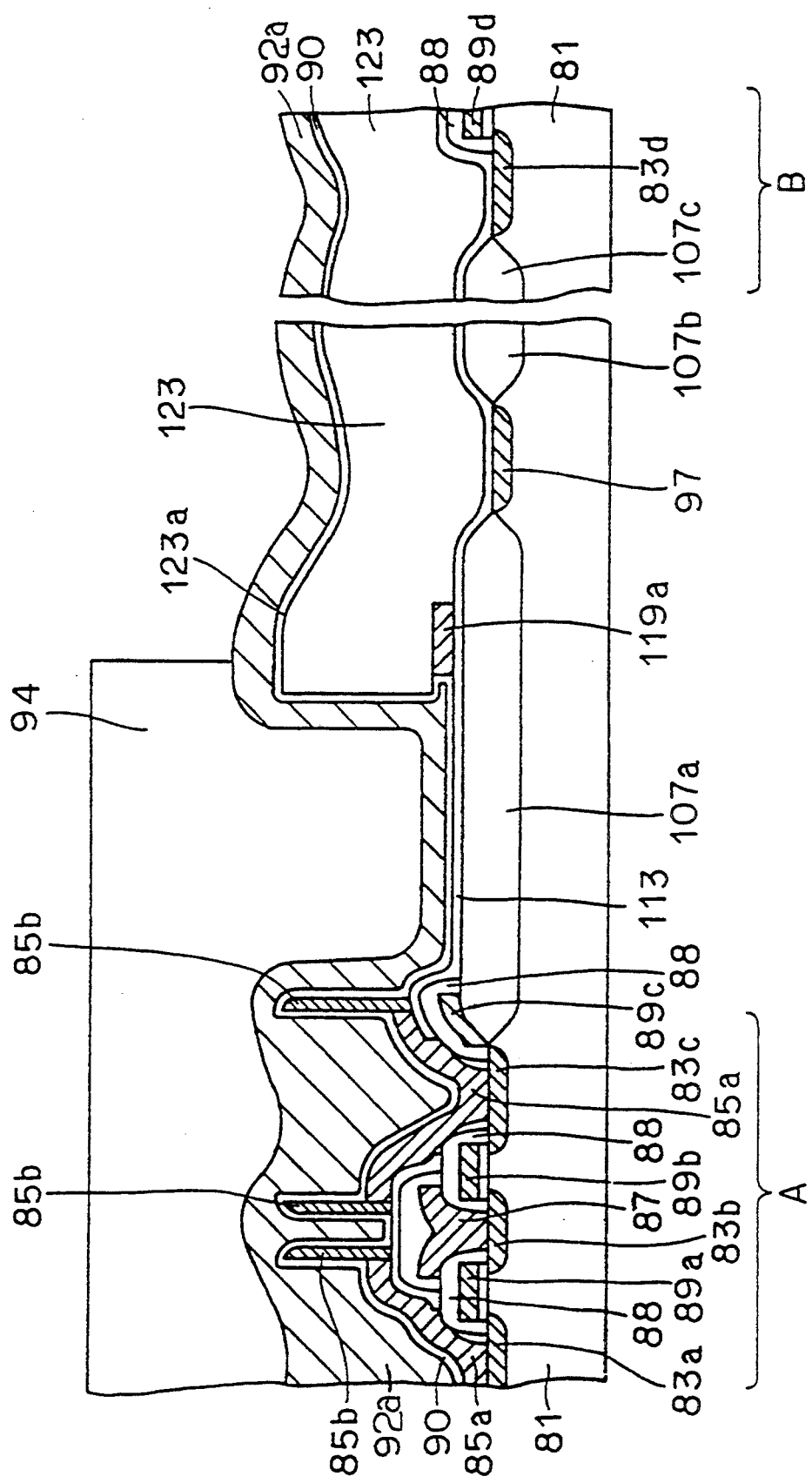
Figure 20:
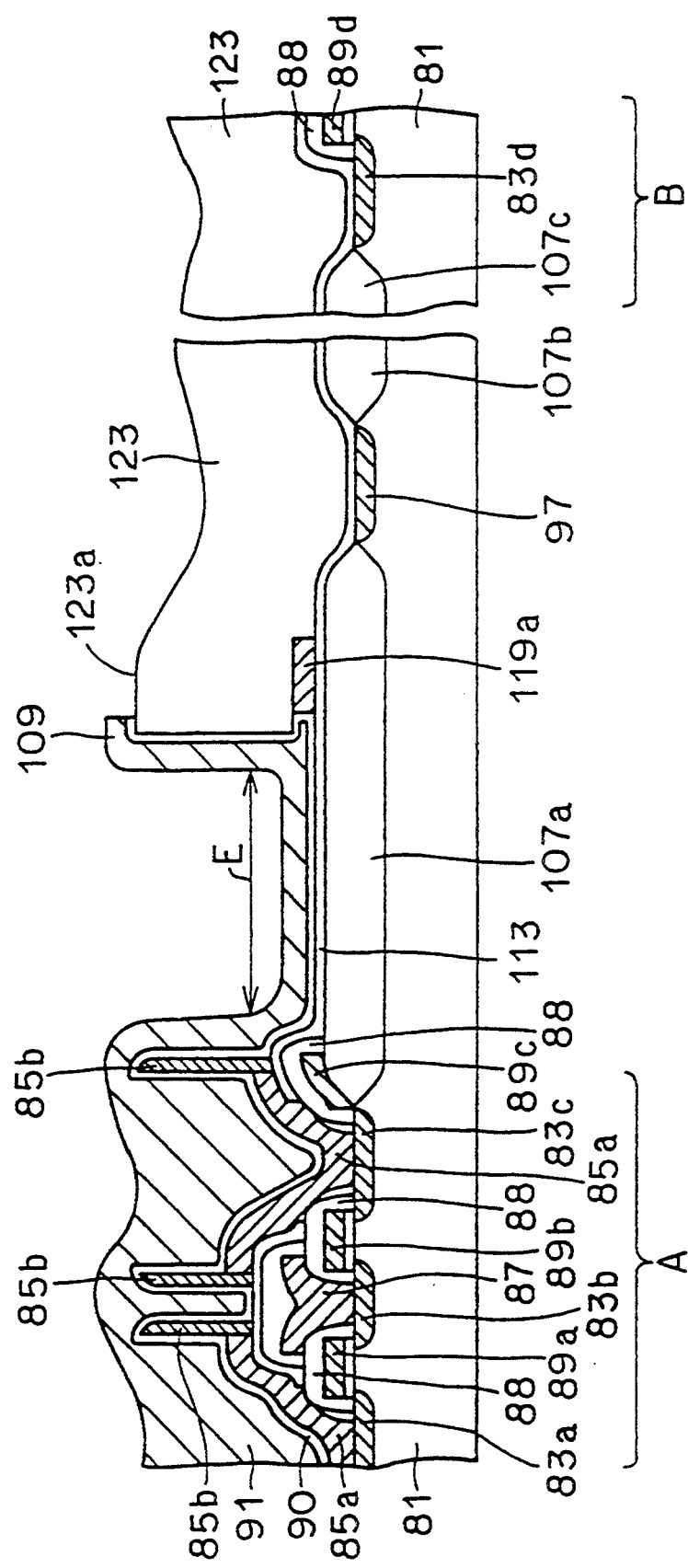

Referring to FIG. 19, dielectric film 90 is formed on the main surface of silicon substrate 81 by a conventional method. Then, polycrystalline silicon film 92a is formed on dielectric film 90 by CVD. A predetermined patterning process is applied using resist 94. Thus, cell plate 91 and lower layer interconnection film 109 are formed as shown in FIG. 20. A portion of lower layer interconnection film 109 extends upon upper face portion 123a of silicon oxide film 123.

Lower layer interconnection film 109 is formed extending upon silicon oxide film 123 in order to ensure that lower layer interconnection film 109 resides in the region indicated by E where a through hole is to be formed. However, it should be noted that the effect of the present invention can be achieved even if lower layer interconnection film 109 is not formed extending upon silicon oxide film 123. The length of the region indicated by E, i.e. the length of the bottom of the concave shape portion is preferably at least 1.0 μm and at most 3.0 μm.

Figure 21:
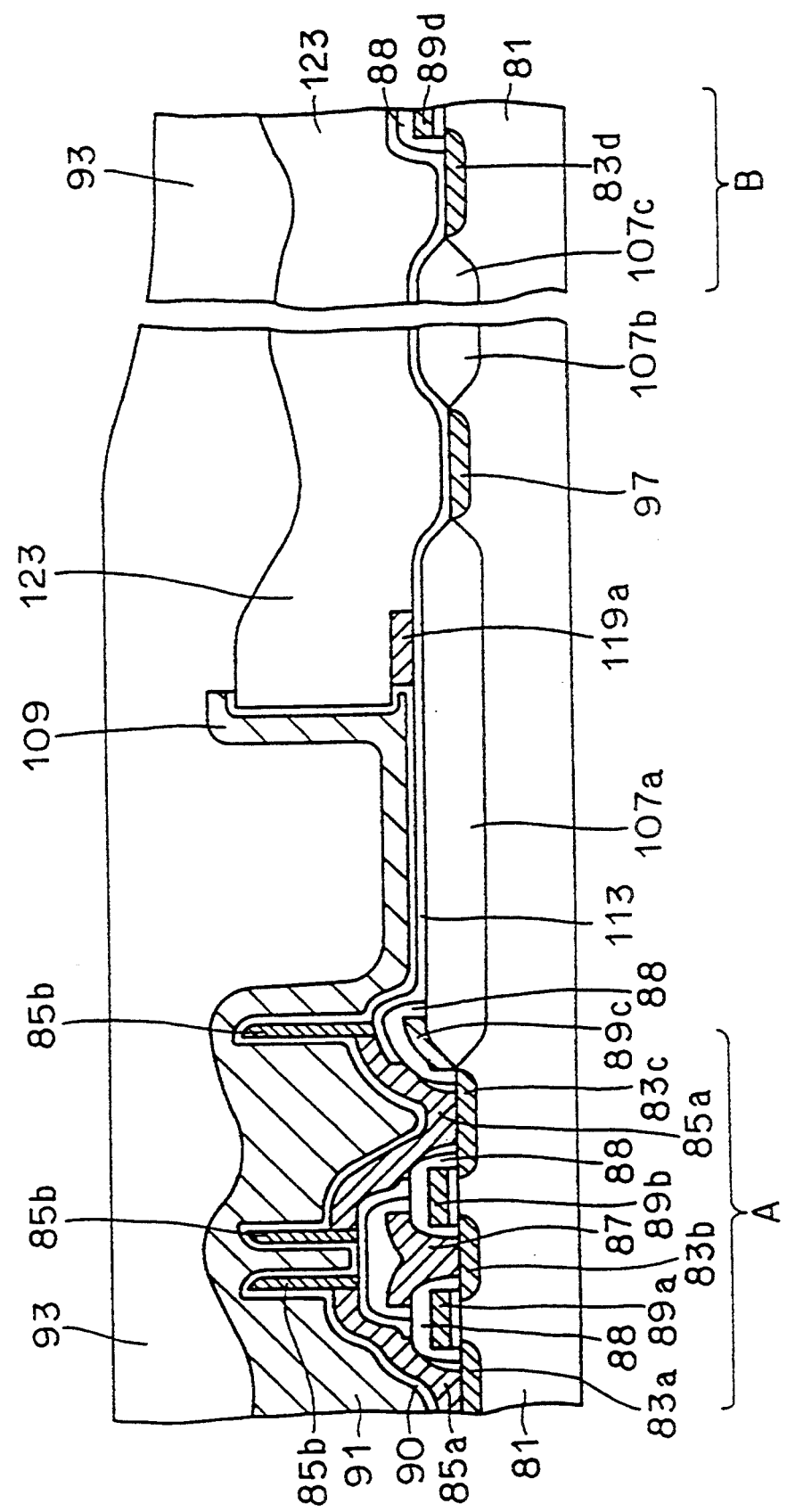

Referring to FIG. 21, silicon oxide film 93 is formed all over the main surface of silicon substrate 81 by CVD.

Figure 22:
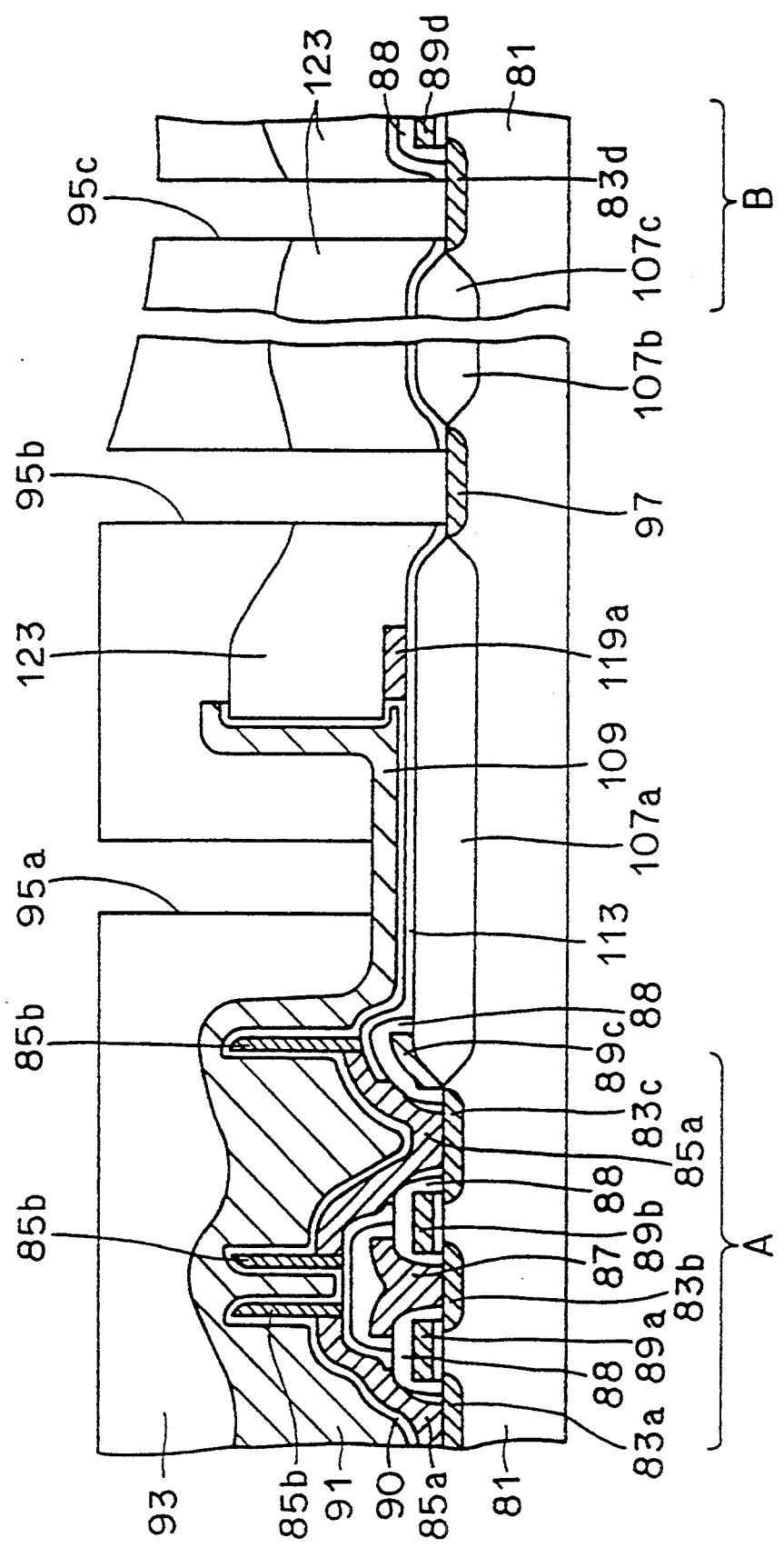

Referring to FIG. 22, silicon oxide films 93 and 123 are selectively removed by conventional photolithography and etching techniques to form through holes 95a, 95b, and 95c. Through hole 95a reaches to the portion of lower layer interconnection film 109 nearest to the main surface of silicon substrate 81, i.e. reaches to the bottom of the concave shape portion.

Figure 23:
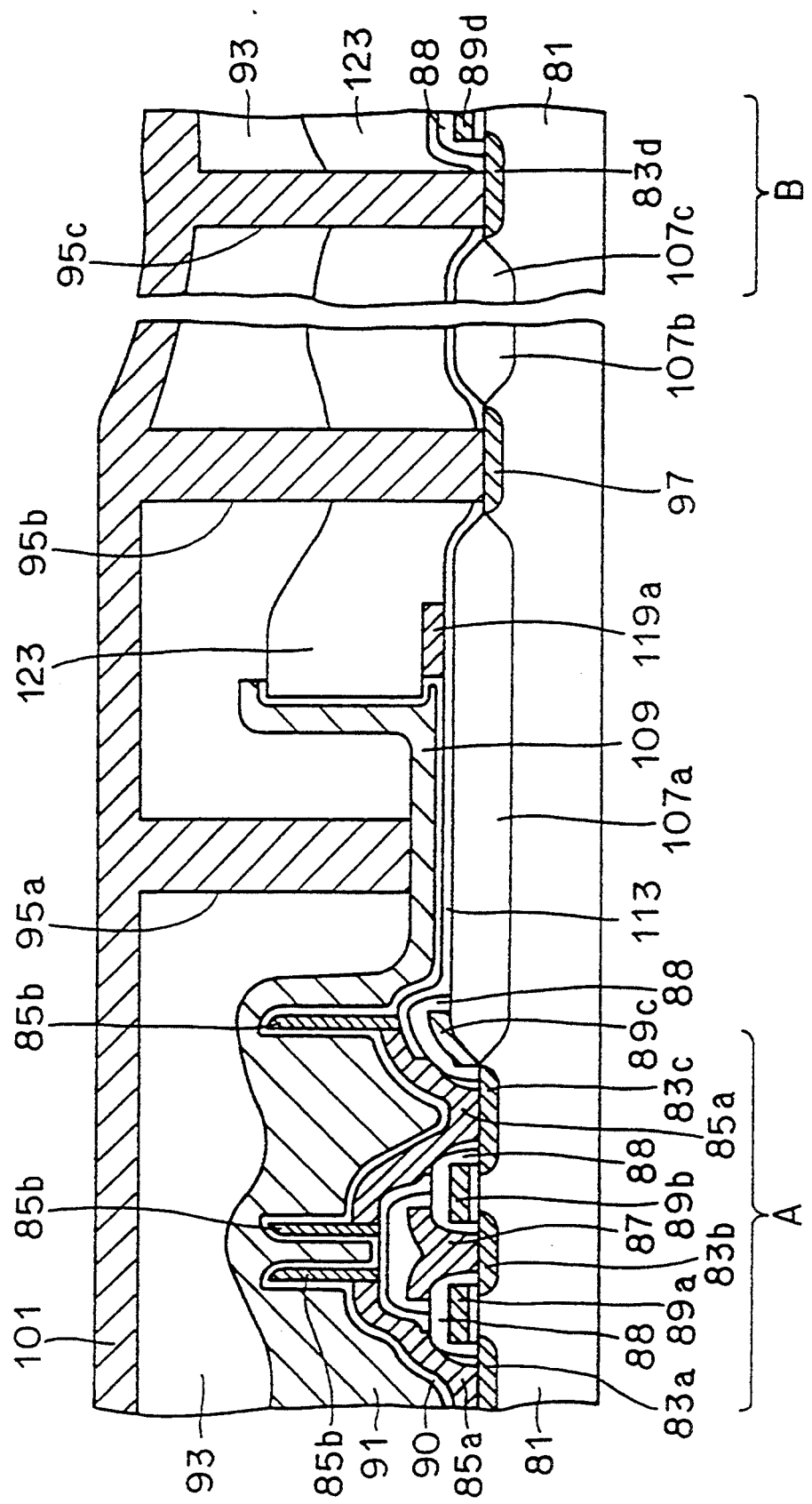

Referring to FIG. 23, tungsten film 101 is formed all over the main surface of silicon substrate 81 by CVD.

Figure 24:
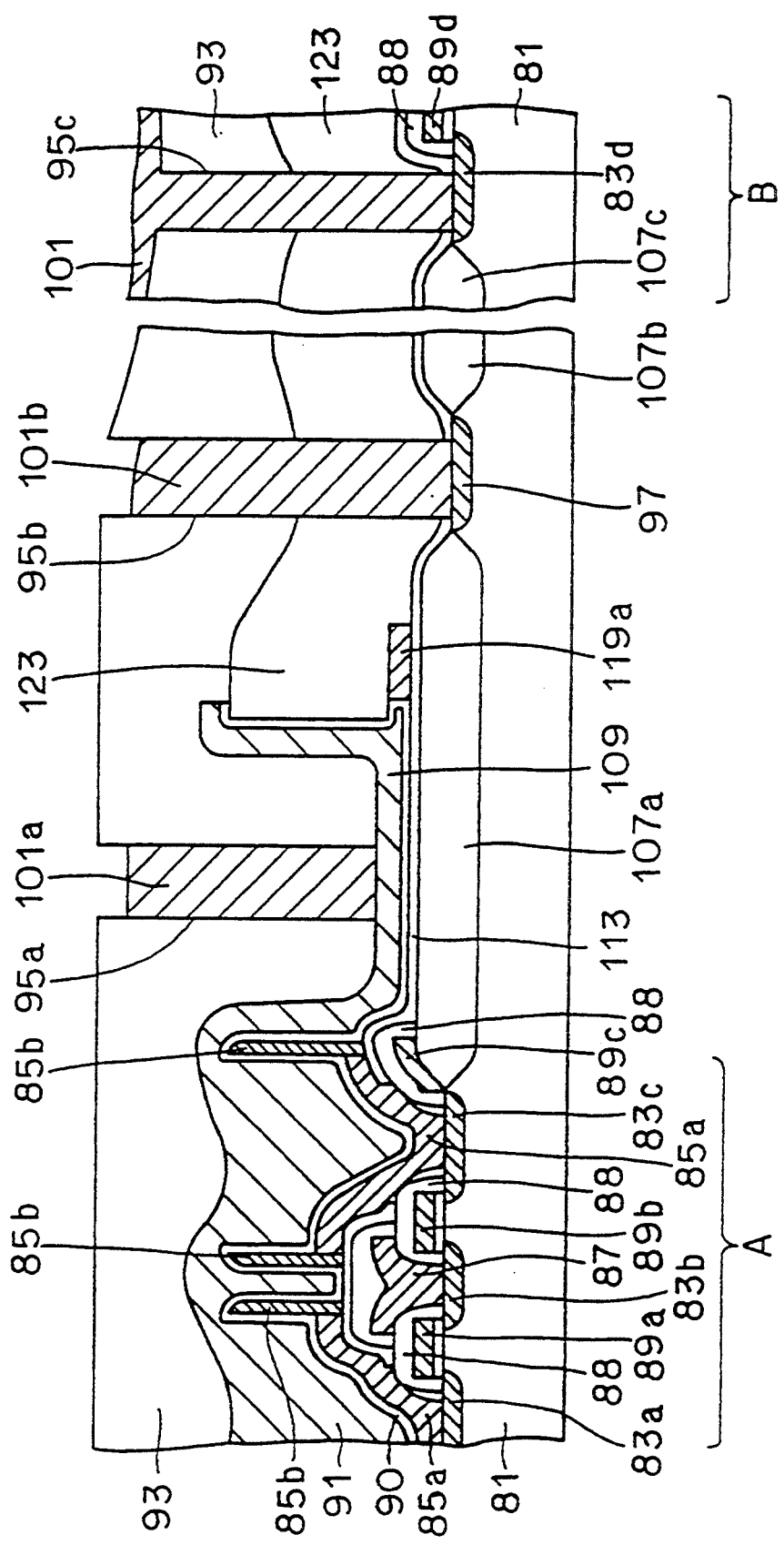

Referring to FIG. 24, tungsten film 101 on silicon oxide film 93 is etched all over. The etching rate and the thickness of the tungsten film differs according to the position of the semiconductor device arranged on a wafer. In the present embodiment, tungsten film 101 on silicon oxide film 93 is not completely removed at the peripheral circuit formation region B. The tungsten film in through hole 95a and through hole 95b are referred to as tungsten film 101a and tungsten film 101b, respectively.

Figure 25:
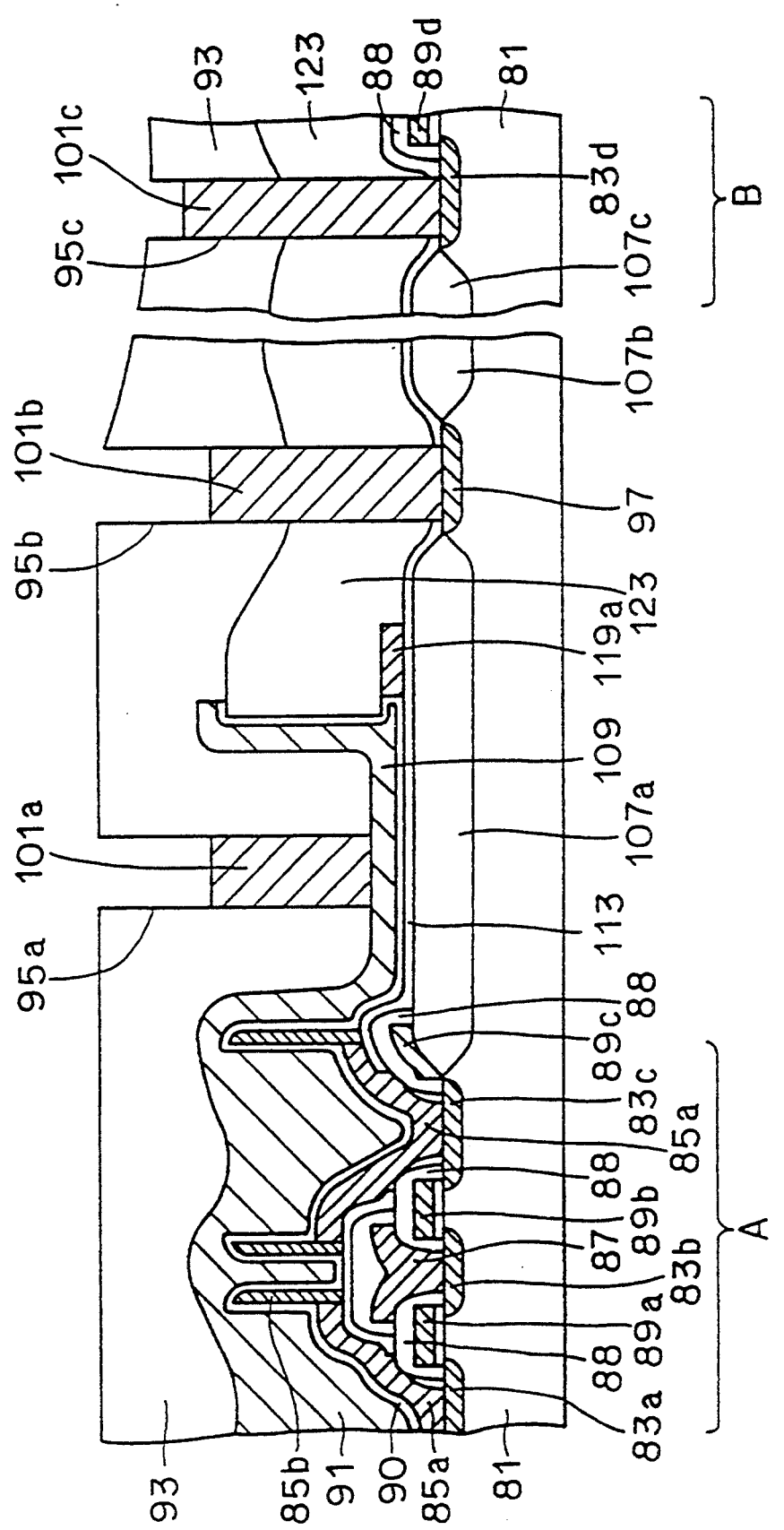

Referring to FIG. 25, the etching process is continued to remove tungsten film 101 remaining on silicon oxide film 93. Conventionally, a through hole reaching lower layer interconnection film 109 was formed on silicon oxide film 123. Therefore, the depth of the through hole was shallow, so that the tungsten film in the through hole and furthermore a portion of lower layer interconnection film 109 were removed by overetching. This problem does not occur in the present first embodiment since the depth of through hole 95a is great.

Figure 26:
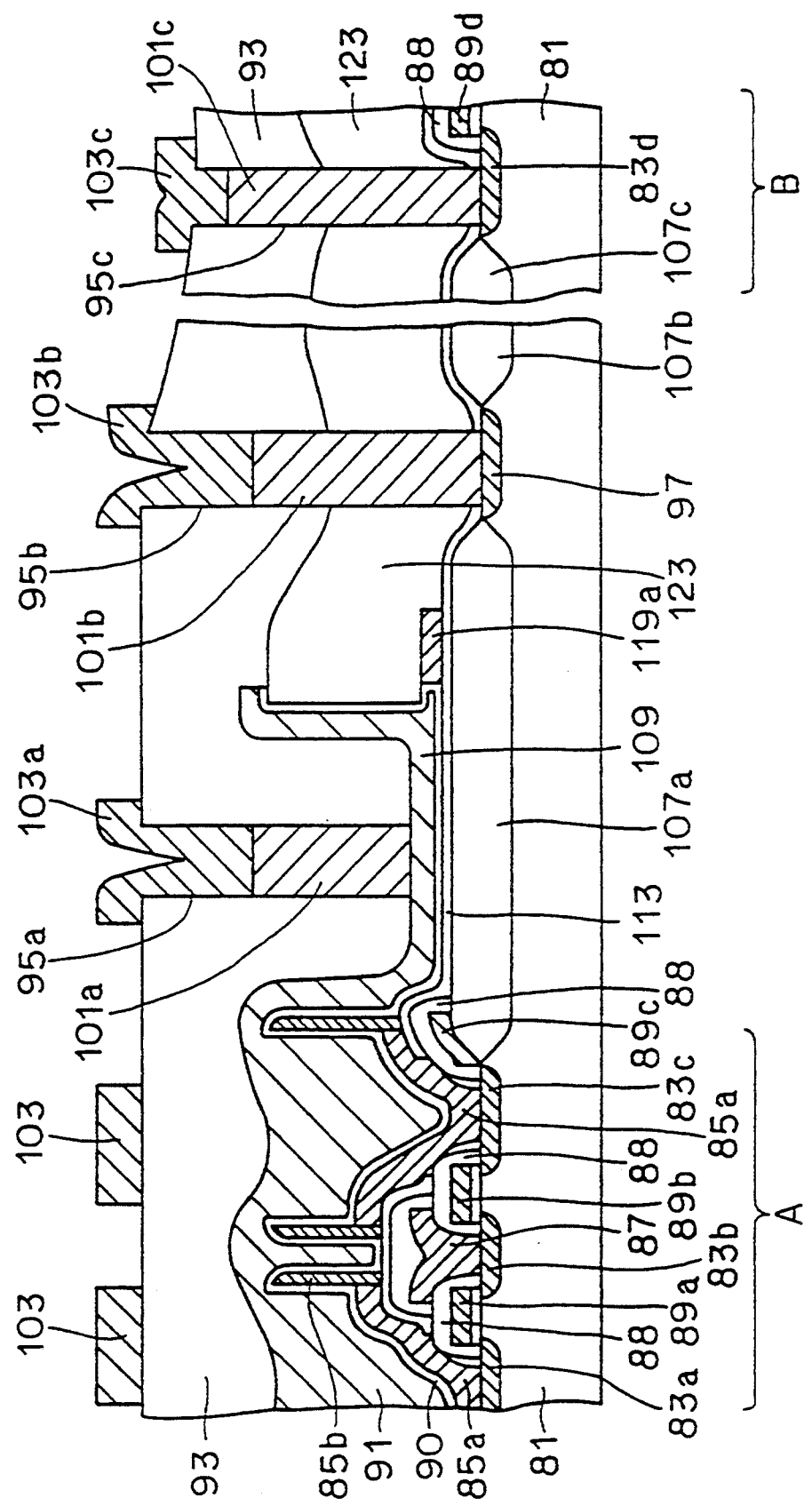

Referring to FIG. 26, an aluminum film is formed on silicon oxide film 93 by sputtering. Then, the aluminum film is subjected to a predetermined patterning to form upper layer interconnection films 103, 103a, 103b, and 103c. Protection film 105 is formed to cover upper layer interconnection films 103, 103a, 103b, and 103c as shown in FIG. 1. This completes the manufacturing method according to the first embodiment of the present invention.

Second Embodiment

Figure 27:
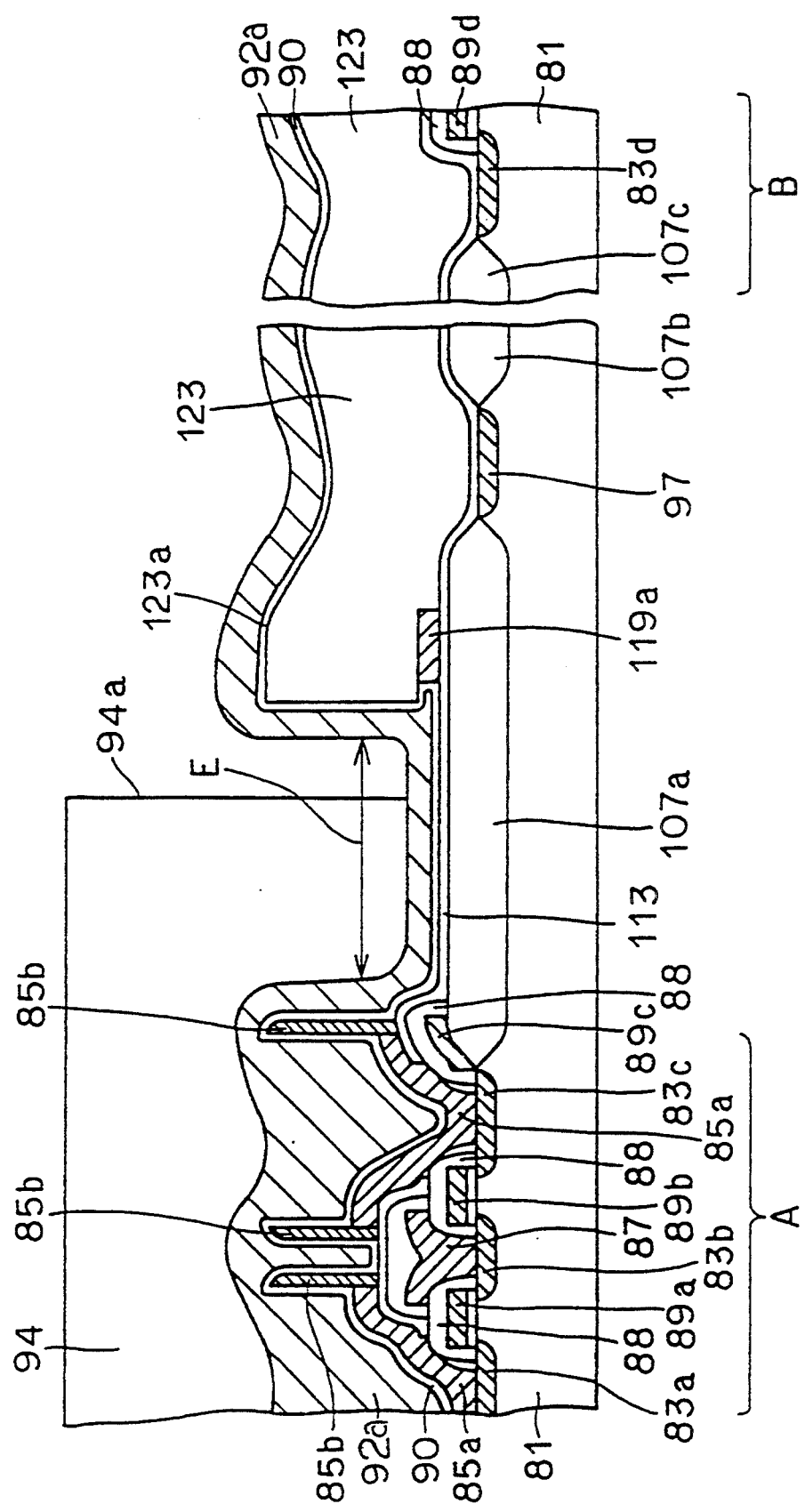
FIGS. 27-29 are sectional views of a semiconductor memory device indicating the processing steps of a manufacturing method according to a second embodiment of the present invention.

The steps described in the first embodiment with reference to FIGS. 2-18 are carried out. Then, dielectric film 90 is formed on the main surface of silicon substrate 81, as shown in FIG. 27. Polycrystalline silicon film 92a is formed on dielectric film 90 by CVD. Resist 94 is formed on polycrystalline silicon film 92a. Exposure and development of resist 94 are carried out such that the side portion 94a is positioned at the region indicated by E after exposure and development of resist 94.

Figure 28:
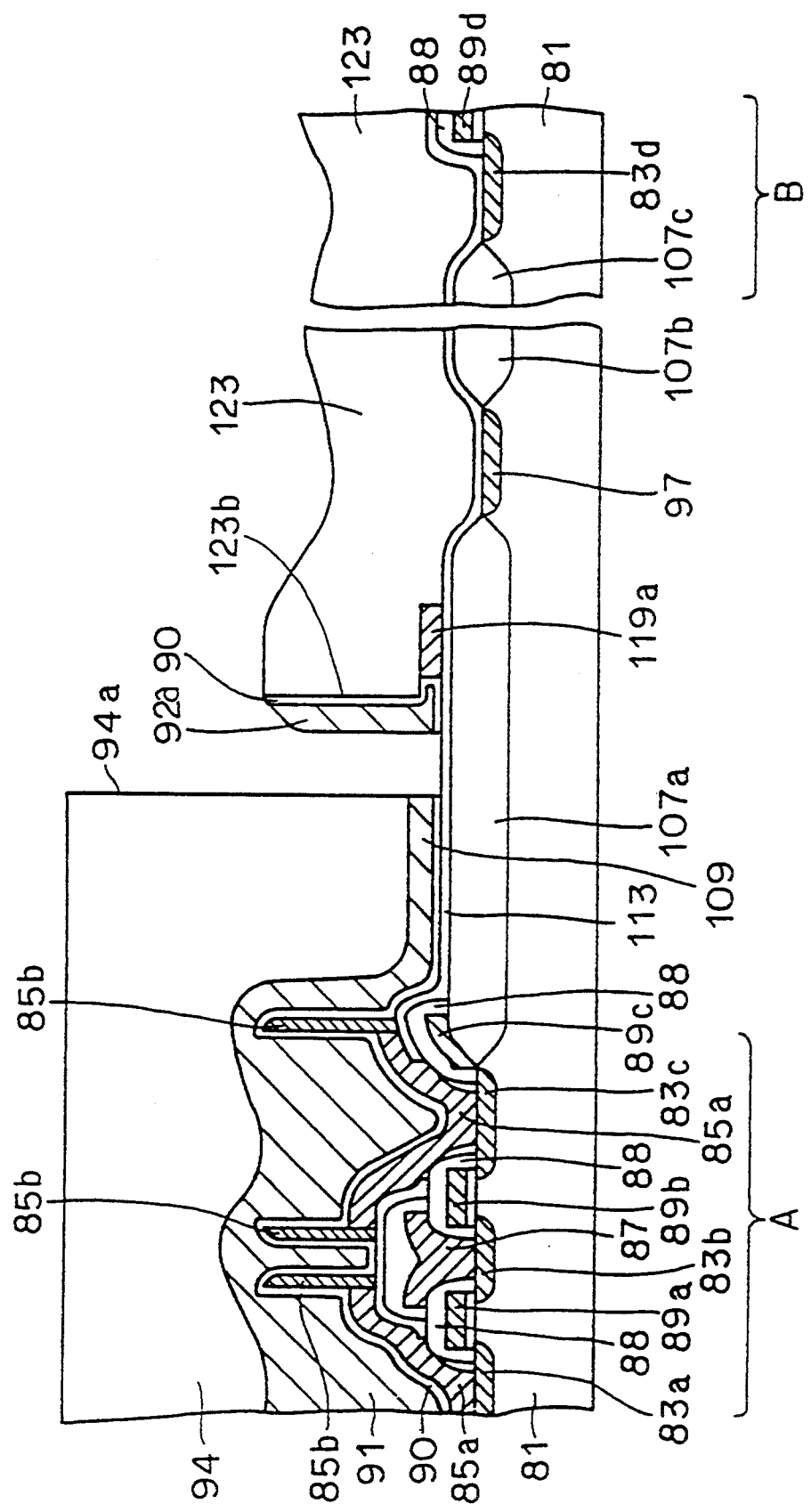
Figure 29:
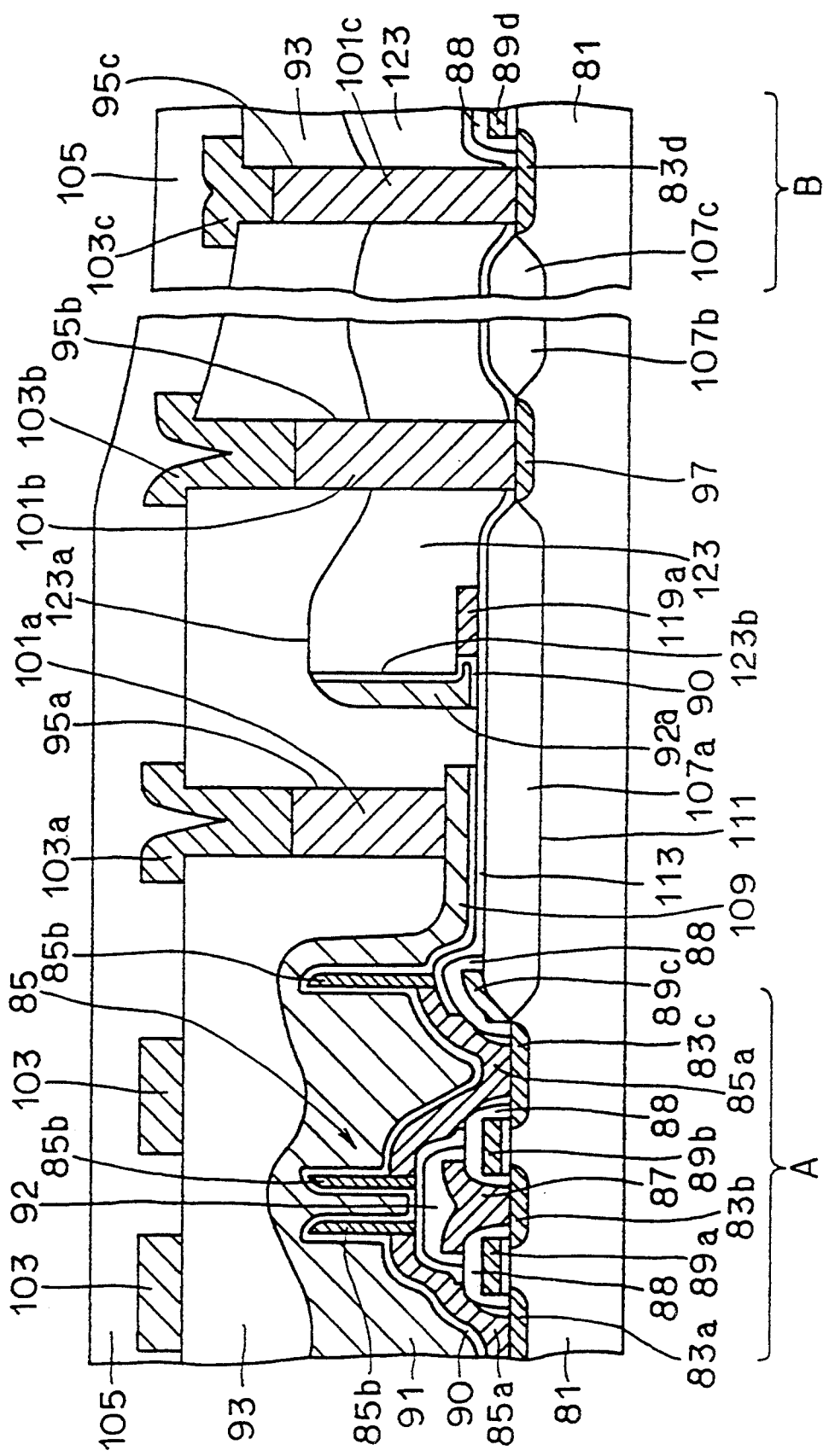

Using resist 94 as a mask, polycrystalline silicon film 92a is removed by anisotropic etching, followed by etching of dielectric film 90 to form cell plate 91, as shown in FIG. 28. Polycrystalline silicon films 92a and dielectric film 90 remain on side portion 123b of silicon oxide film 123 because anisotropic etching is used. Then, the steps described in the first embodiment with reference to FIGS. 20-25 are carried out to complete the second embodiment of the present invention as shown in FIG. 29.

In comparison with the first embodiment where the end portion of lower layer interconnection film 109 extends upon upper face portion 123a of silicon oxide film 123, the end portion of lower layer interconnection film 109 resides short of side portion 123b of silicon oxide film 123 in the second embodiment.

Third Embodiment

Figure 30:
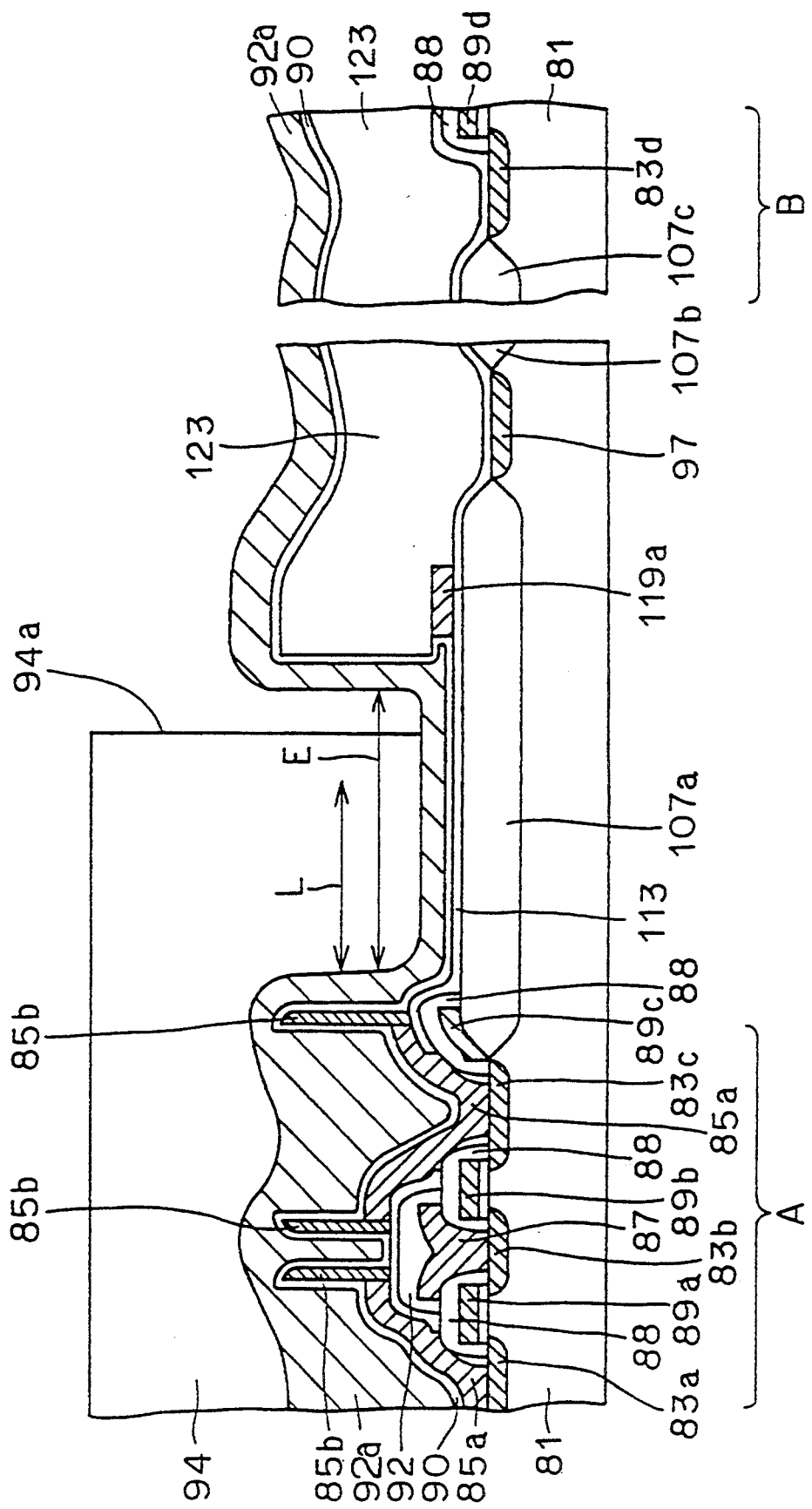
FIGS. 30-32 are sectional views of a semiconductor memory device indicating the processing steps of a manufacturing method according to a third embodiment of the present invention.

The steps described in the first embodiment with reference to FIGS. 2-18 are carried out. Then, dielectric film 90 is formed on the main surface of silicon substrate 81 as shown in FIG. 30. Polycrystalline silicon film 92a is formed on dielectric film 90 by CVD. Resist 94 is formed on polycrystalline silicon film 92a. Resist 94 was exposed and developed such that side portion 94a of resist 94 is positioned in the region shown by E.

Figure 31:
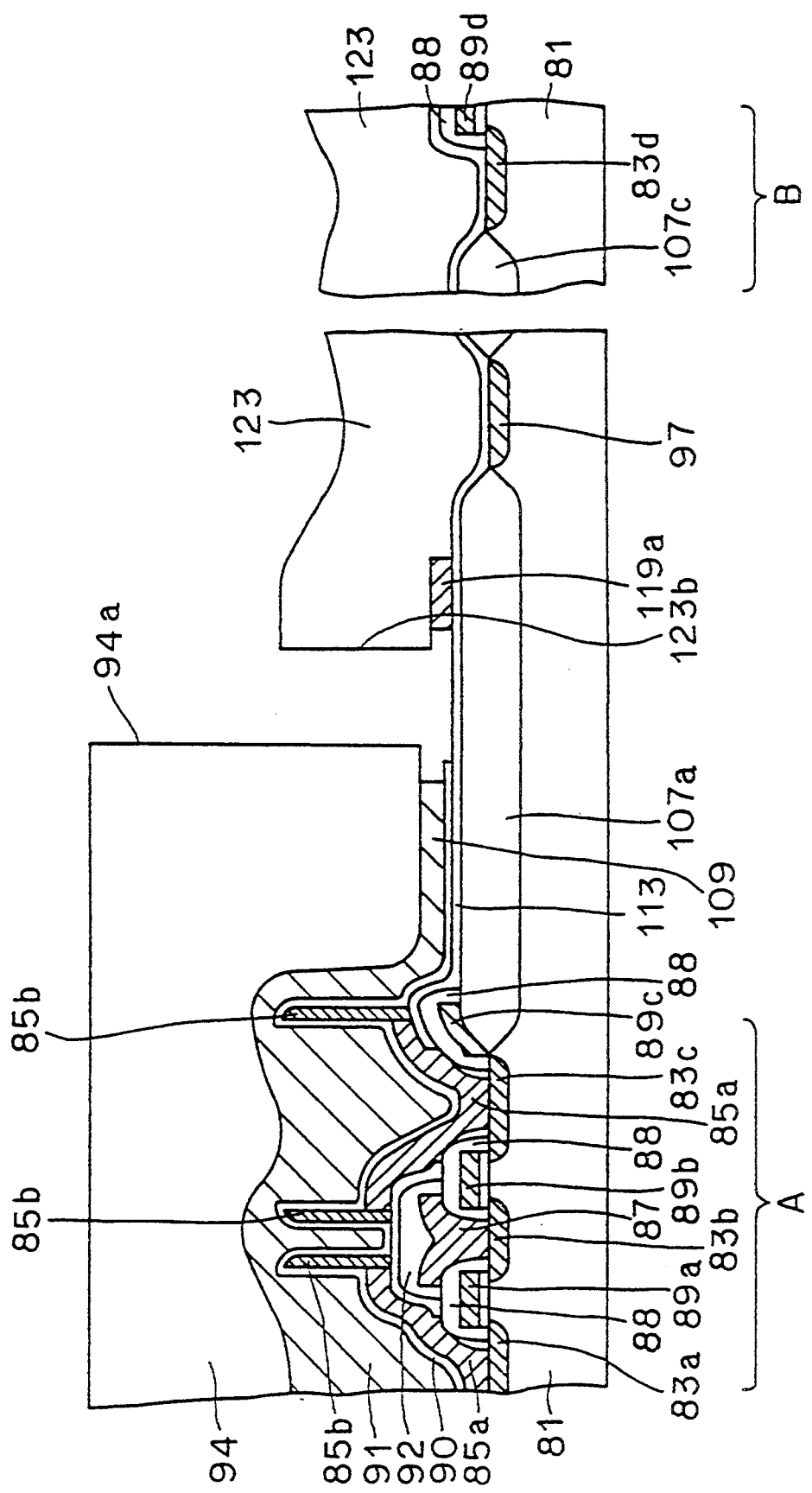

Using resist 94 as a mask, polycrystalline silicon film 92a is isotropically etched, followed by etching of dielectric film 90 to form cell plate 91, as shown in FIG. 31. Because isotropic etching is used, dielectric film 90 and polycrystalline silicon film 92a do not remain on side portion 123b of silicon oxide film 123. Then, the steps described in the first embodiment with reference to FIGS. 20-25 are carried out to complete the third embodiment of the present invention as shown in FIG. 32.

In the second embodiment shown in FIG. 28, dielectric film 90 and polycrystalline silicon film 92a remain on side portion 123b. It is preferable that dielectric film 90 and polycrystalline silicon film 92a do not remain on side portion 123b since there is a possibility that they might be peeled off to become foreign particles. Because isotropic etching is used in third embodiment as shown in FIG. 31, dielectric film 90 and polycrystalline silicon film 92a do not remain on side portion 123b.

Figure 32:
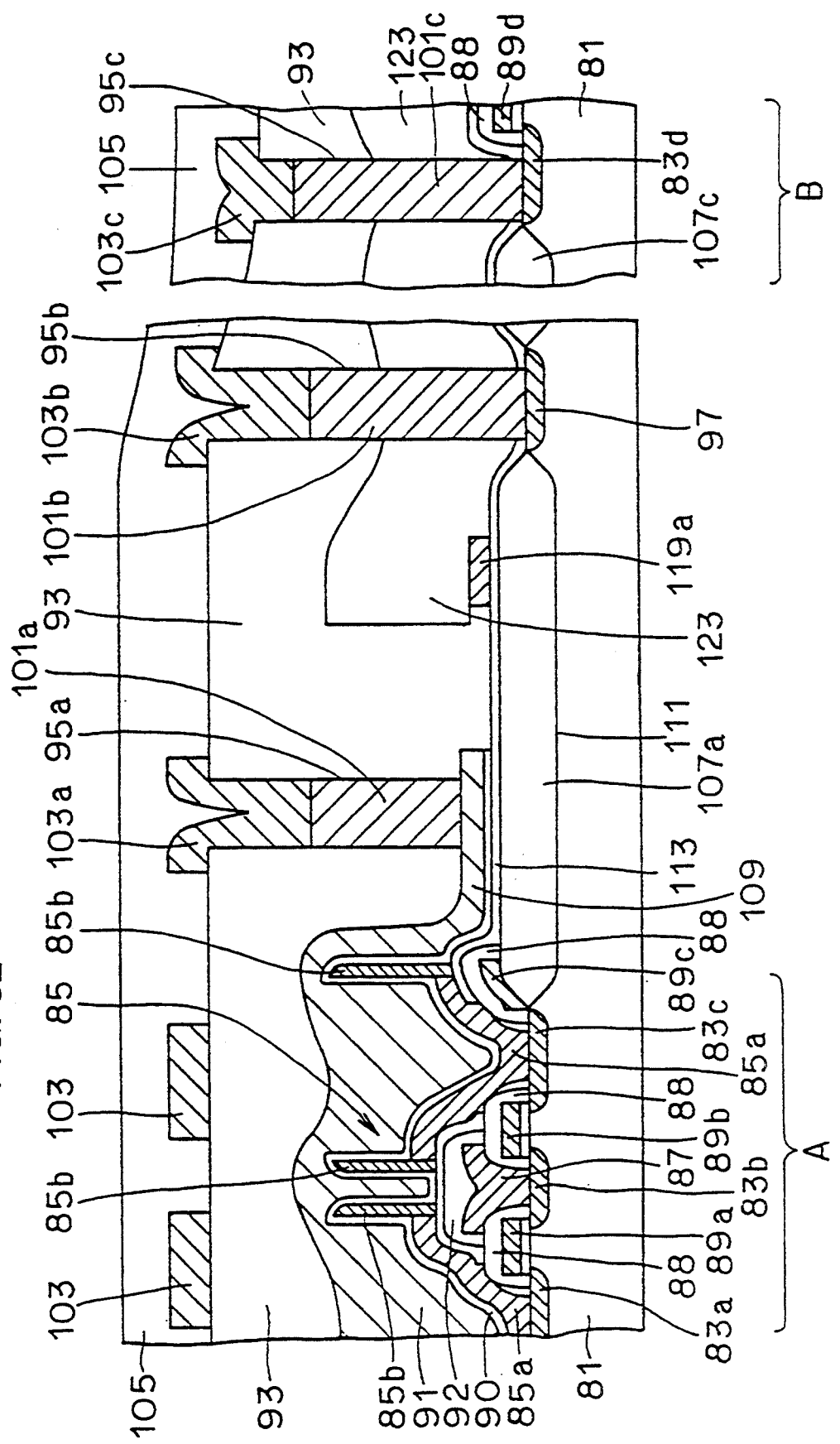

Lower layer interconnection film 109 must have a predetermined length so that through hole 95 is reliably positioned on lower layer interconnection film 109, shown in FIG. 32. Because isotropic etching is used in the third embodiment, side etching proceeds as shown in FIG. 31. The end portion of lower layer interconnection film 109 is found inside side portion 94a of resist 94. In view of such side etching, it is necessary to carry out exposure and development of resist 94 so that the length of resist 94 after exposure and development becomes greater than the design value L of the length of lower layer interconnection film 109. Because the length of resist 94 after exposure and development increases, the distance indicated by E must be increased in comparison with the second embodiment. Therefore, from the standpoint of miniaturization, the second embodiment is more advantageous since the distance indicated by E can be made smaller.

Fourth Embodiment

Figure 33:
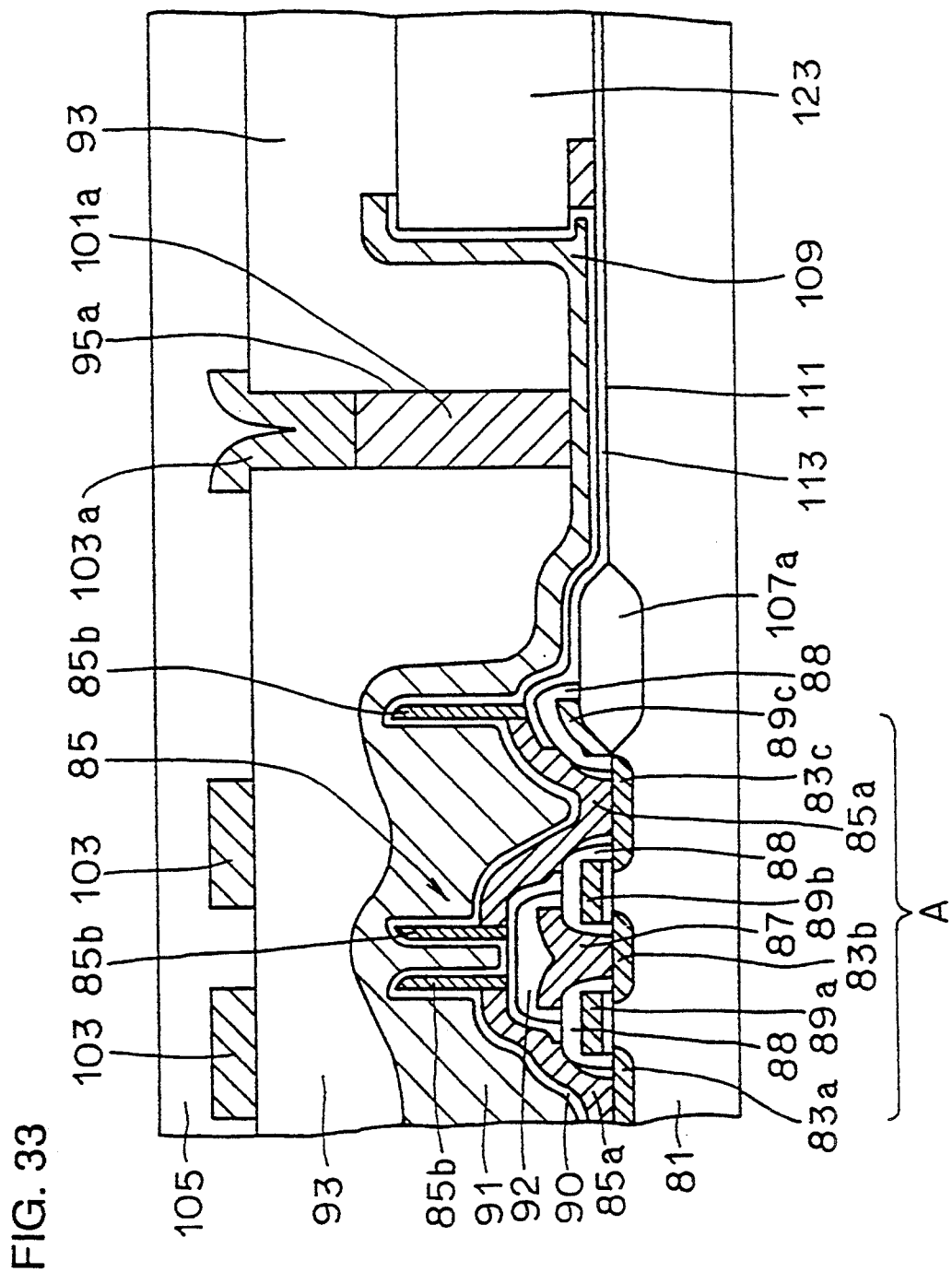
FIG. 33 is a sectional view of a semiconductor device of a fourth embodiment of the present invention.
Figure 34:
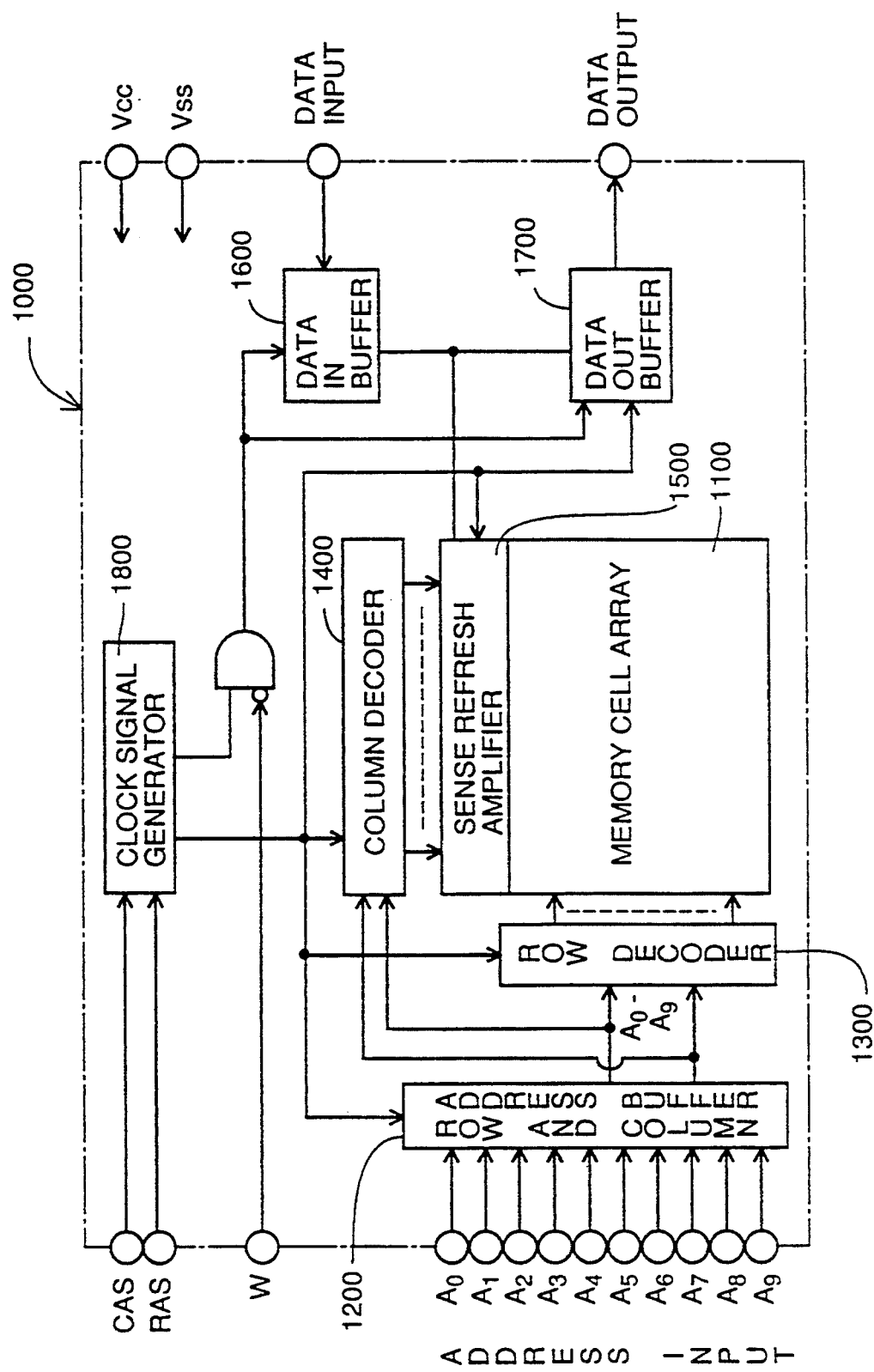
FIG. 34 is a block diagram of a conventional DRAM.
Figure 35:
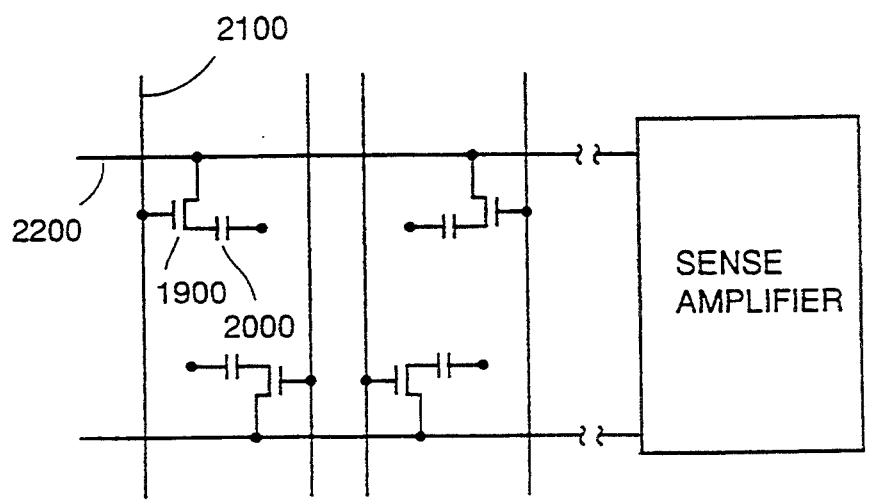
FIG. 35 is an equivalent circuit diagram of a conventional memory cell.
Figure 36:
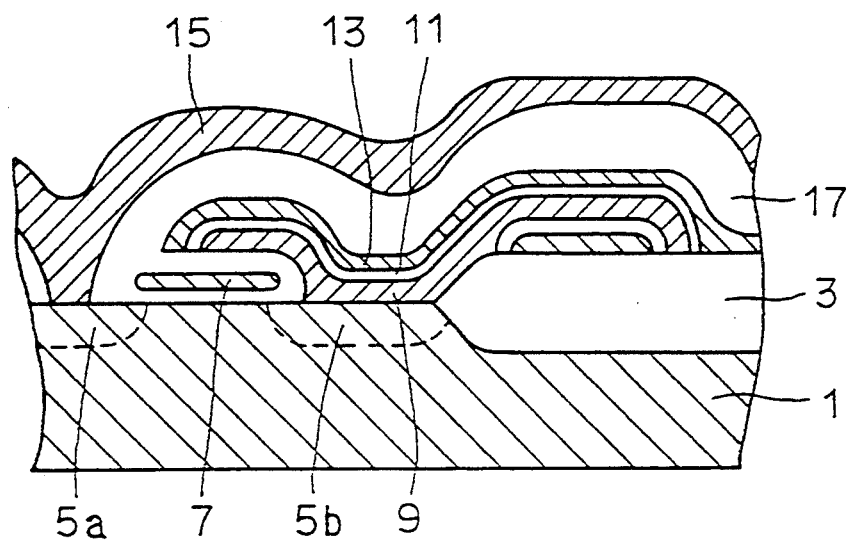
FIG. 36 is a sectional structural view of a memory cell including a conventional stacked type capacitor.
Figure 37:
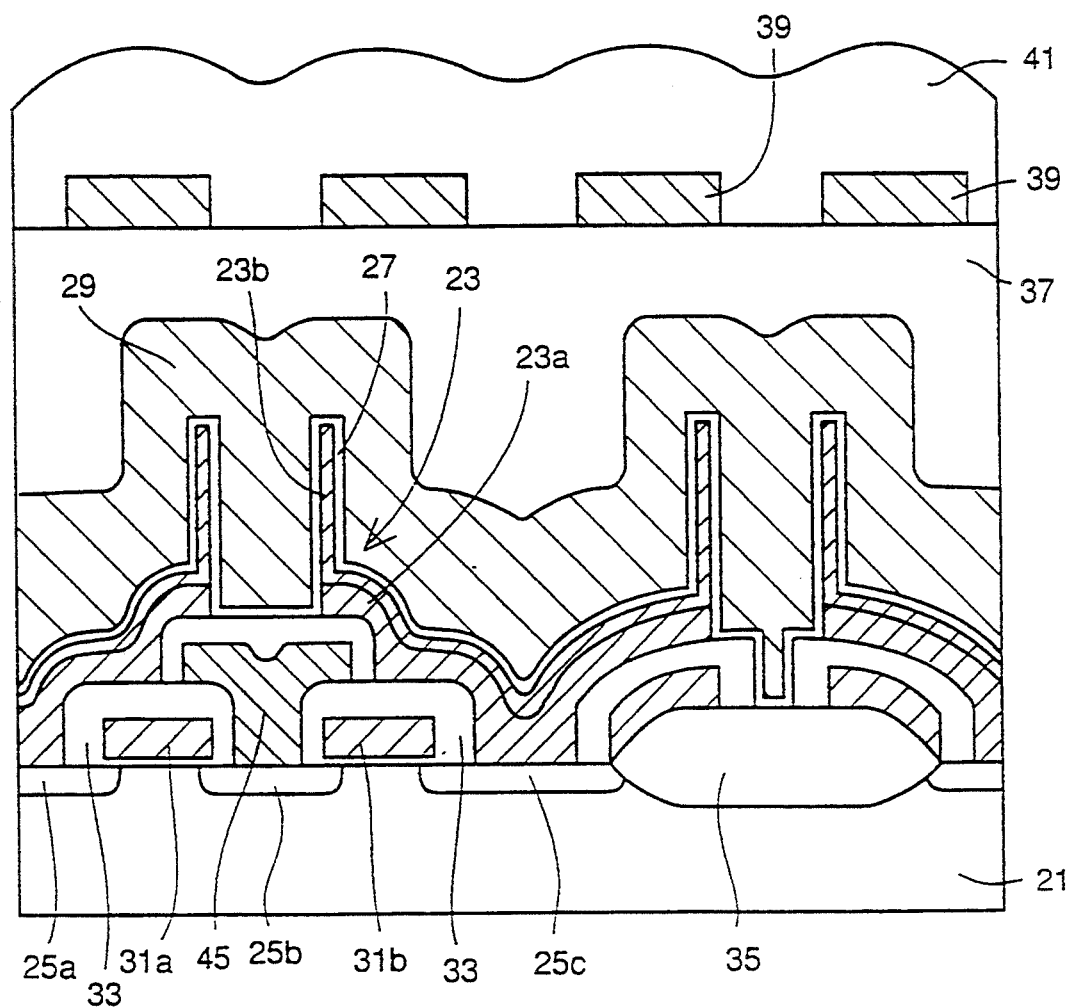
FIG. 37 is a sectional structural view of a memory cell including another conventional stacked type capacitor.
Figure 38:
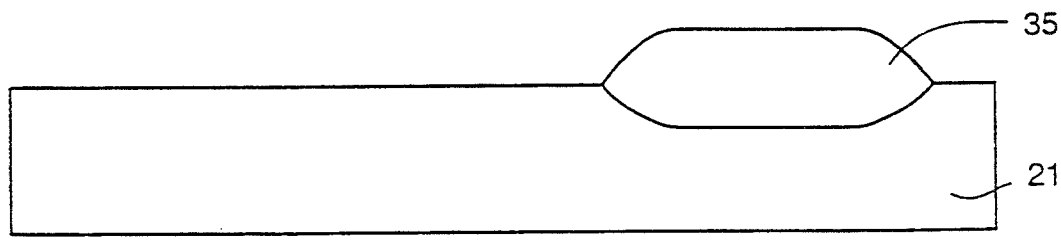
FIGS. 38-51 are sectional views of a capacitor of FIG. 37 showing the processing steps of a manufacturing method thereof.
Figure 39:
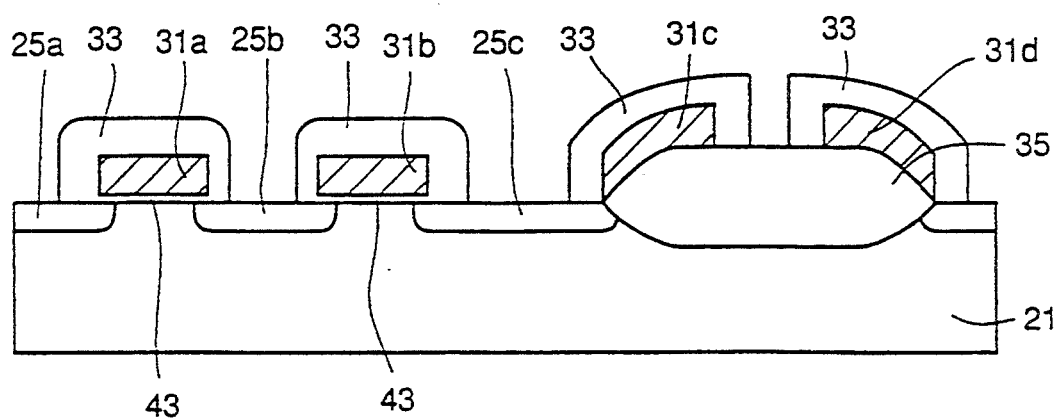
Figure 40:
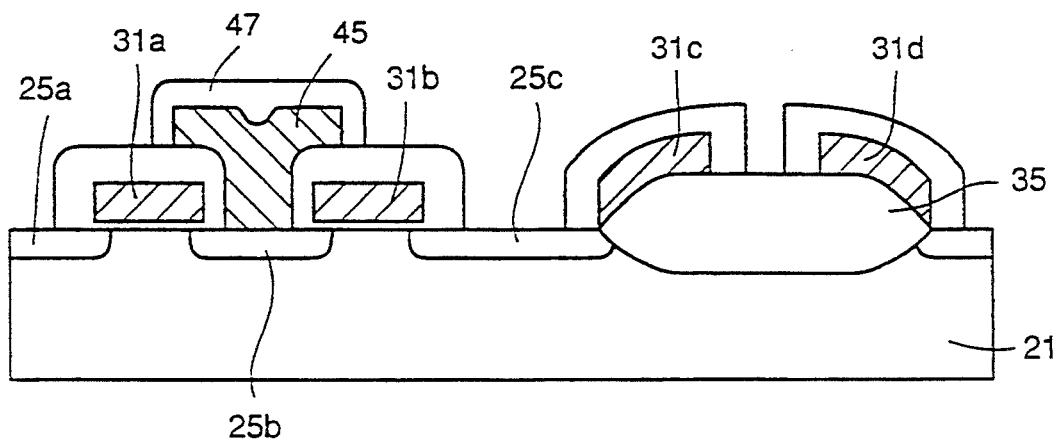
Figure 41:
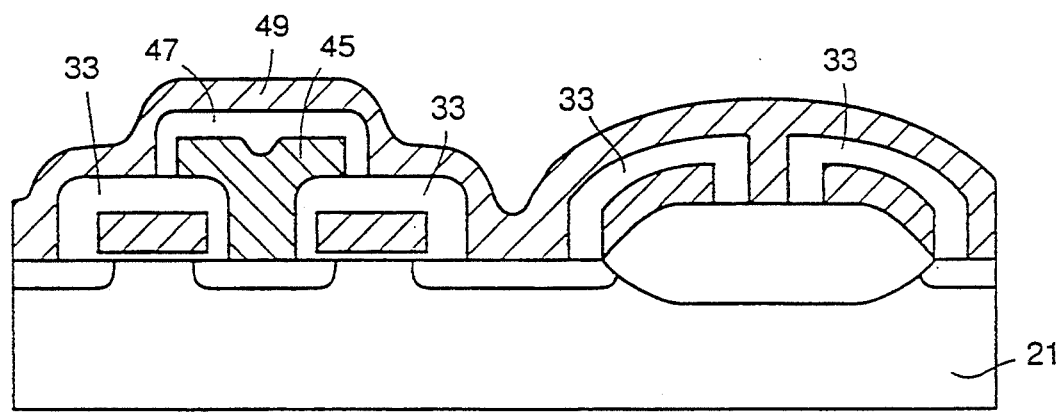
Figure 42:
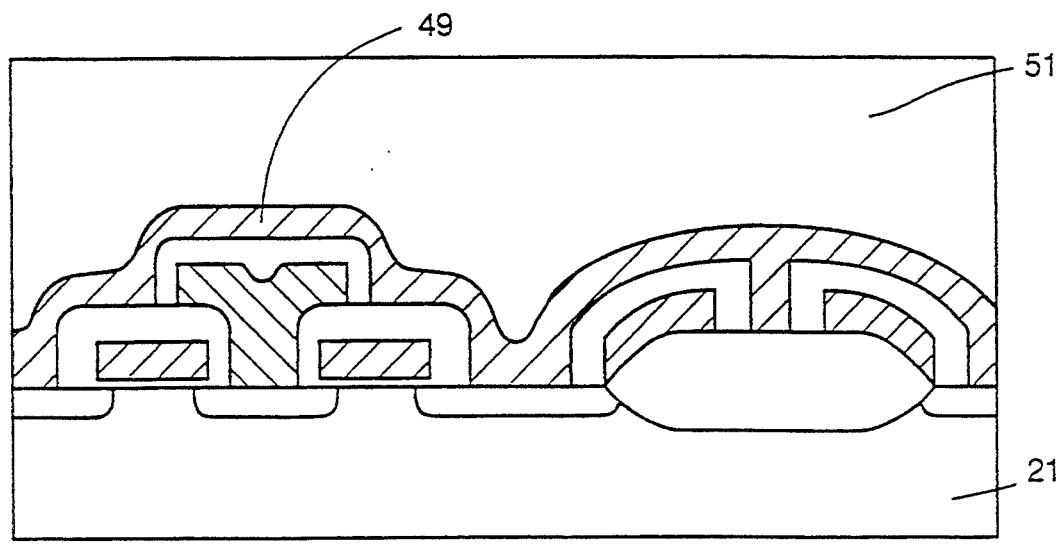
Figure 43:
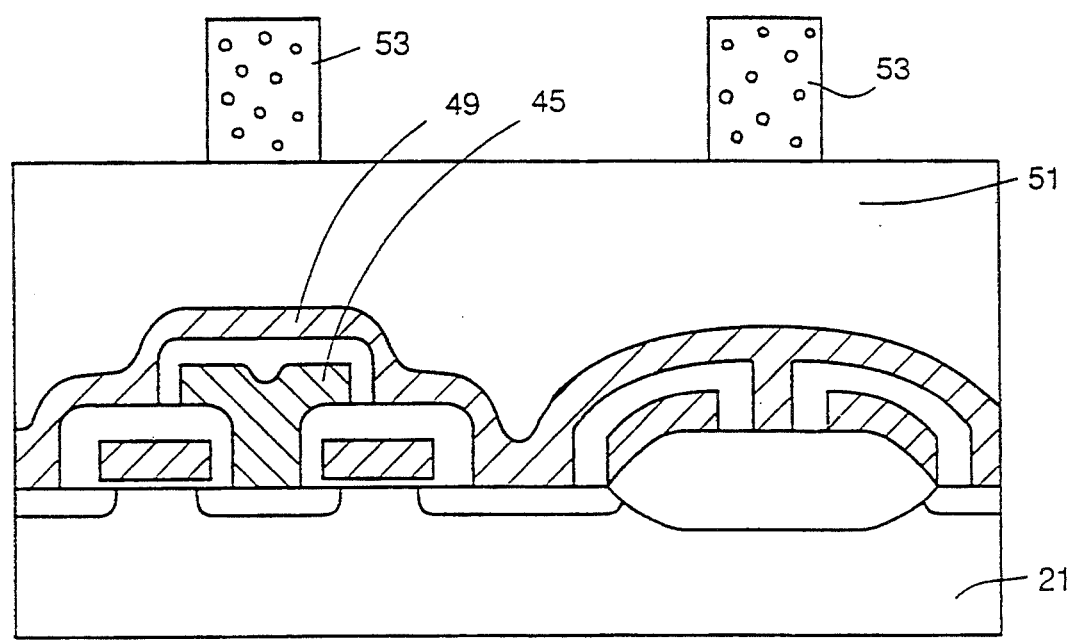
Figure 44:
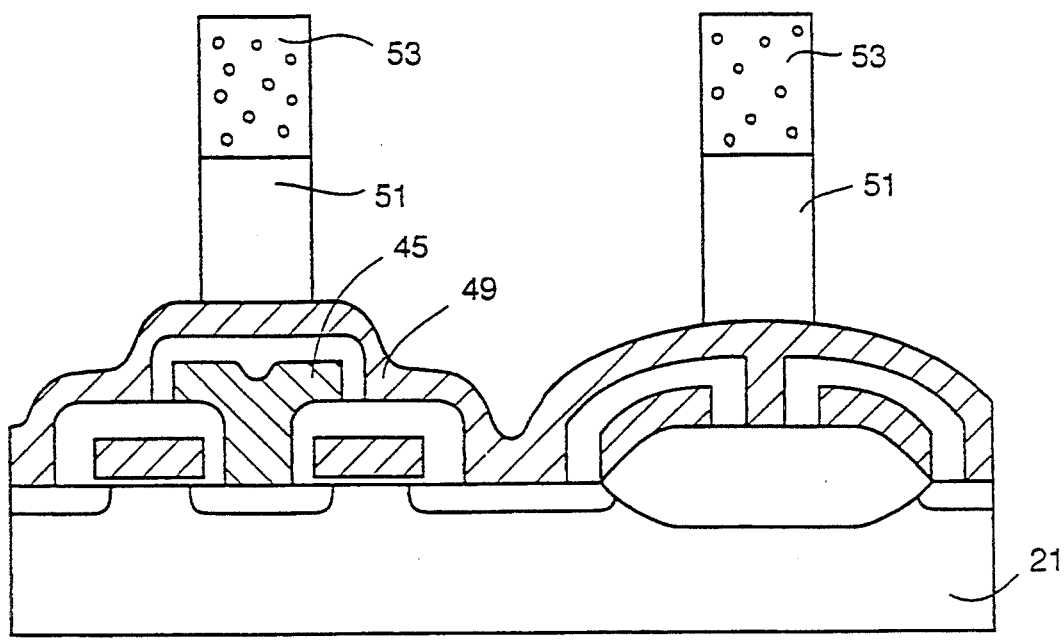
Figure 45:
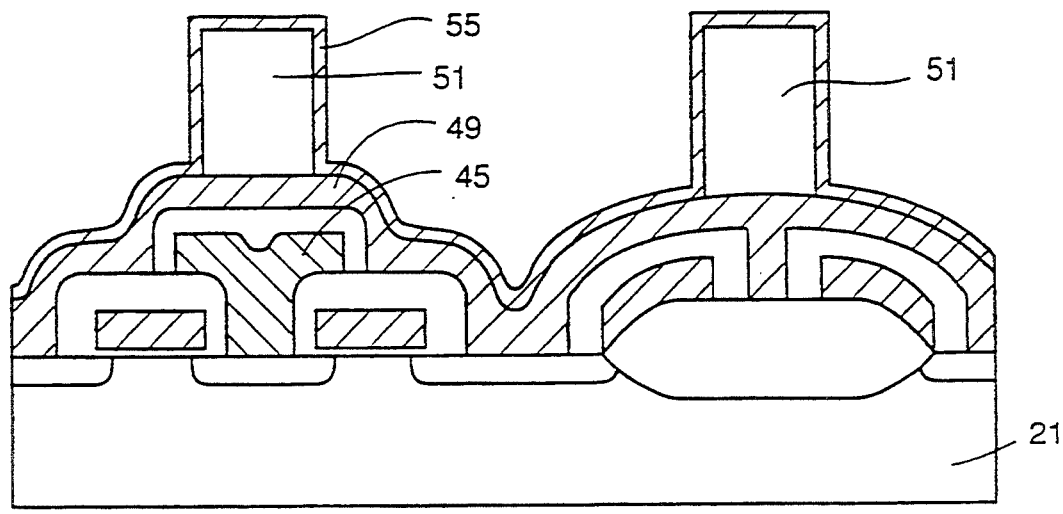
Figure 46:
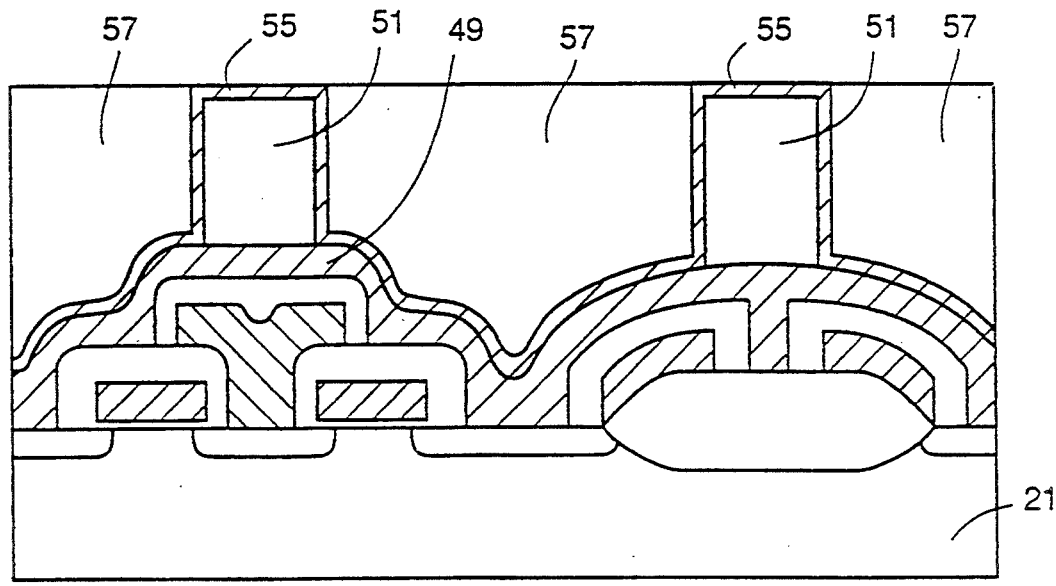
Figure 47:
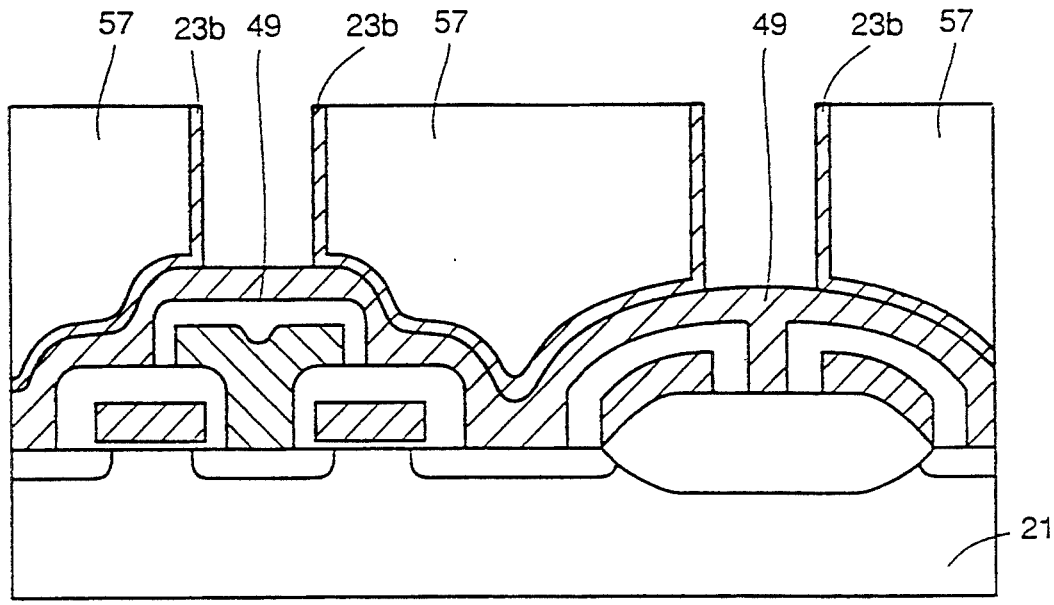
Figure 48:
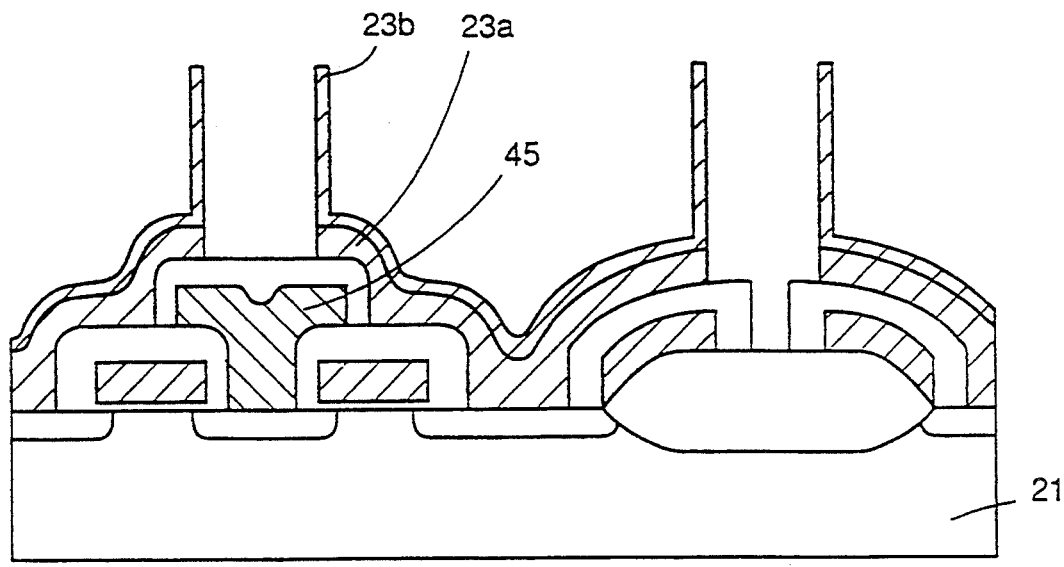
Figure 49:
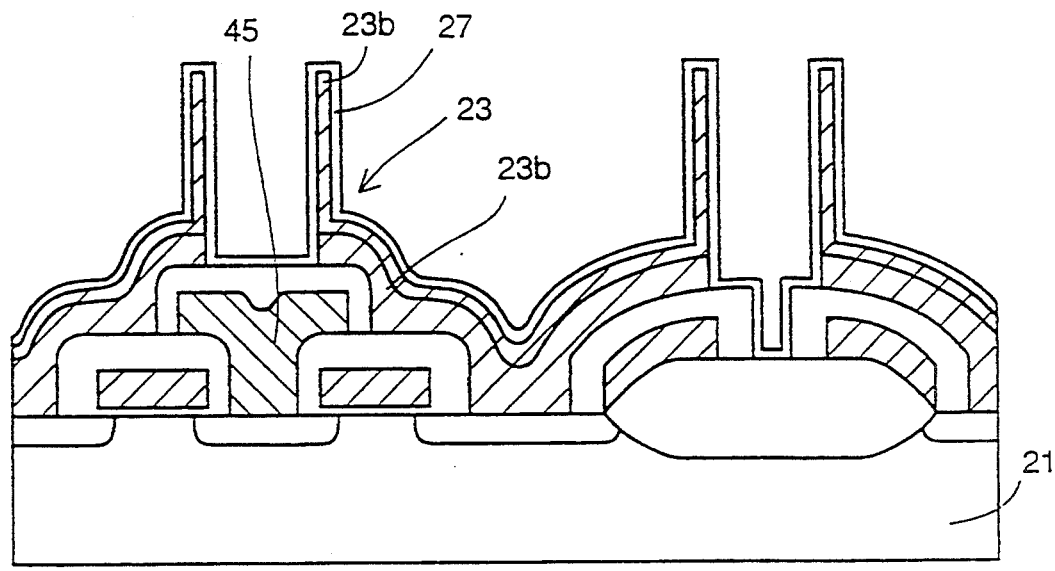
Figure 50:
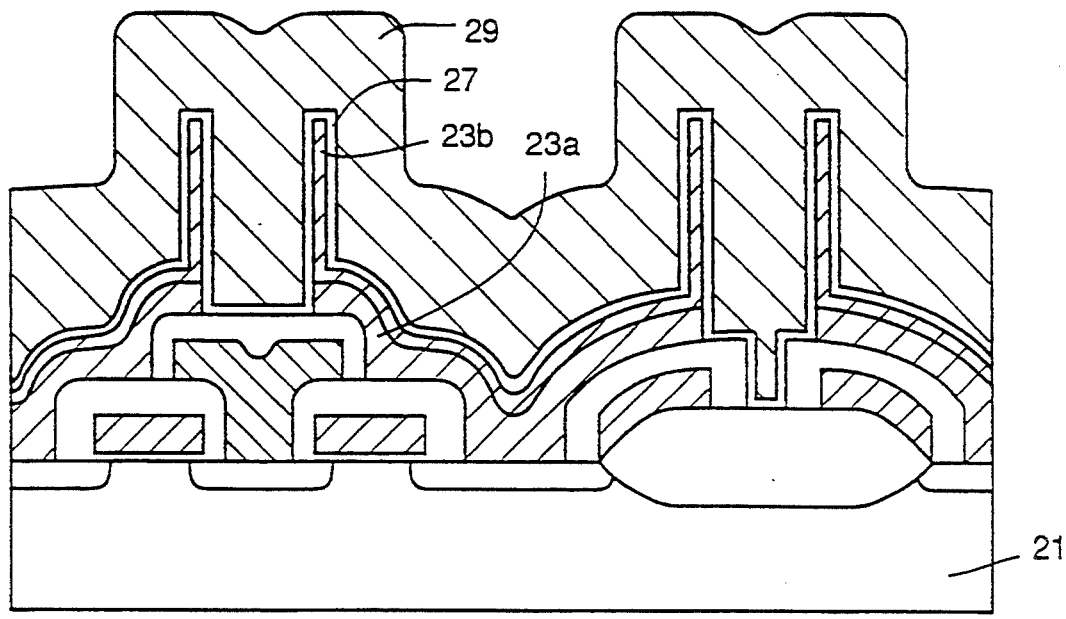
Figure 51:
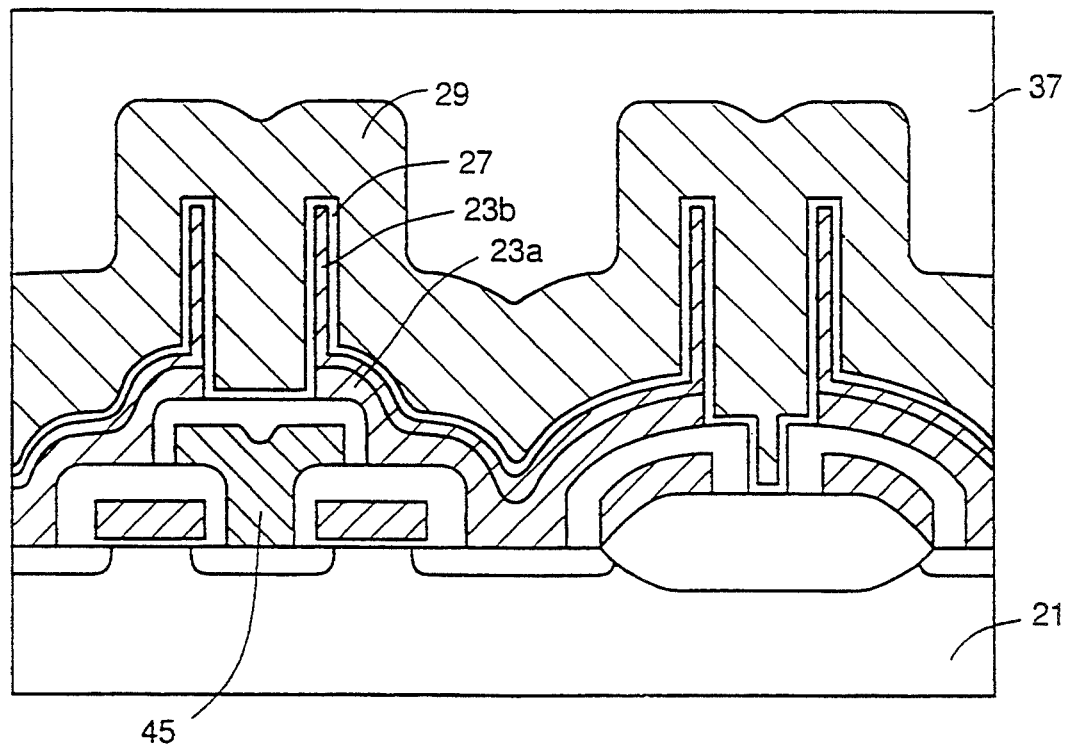
Figure 52:
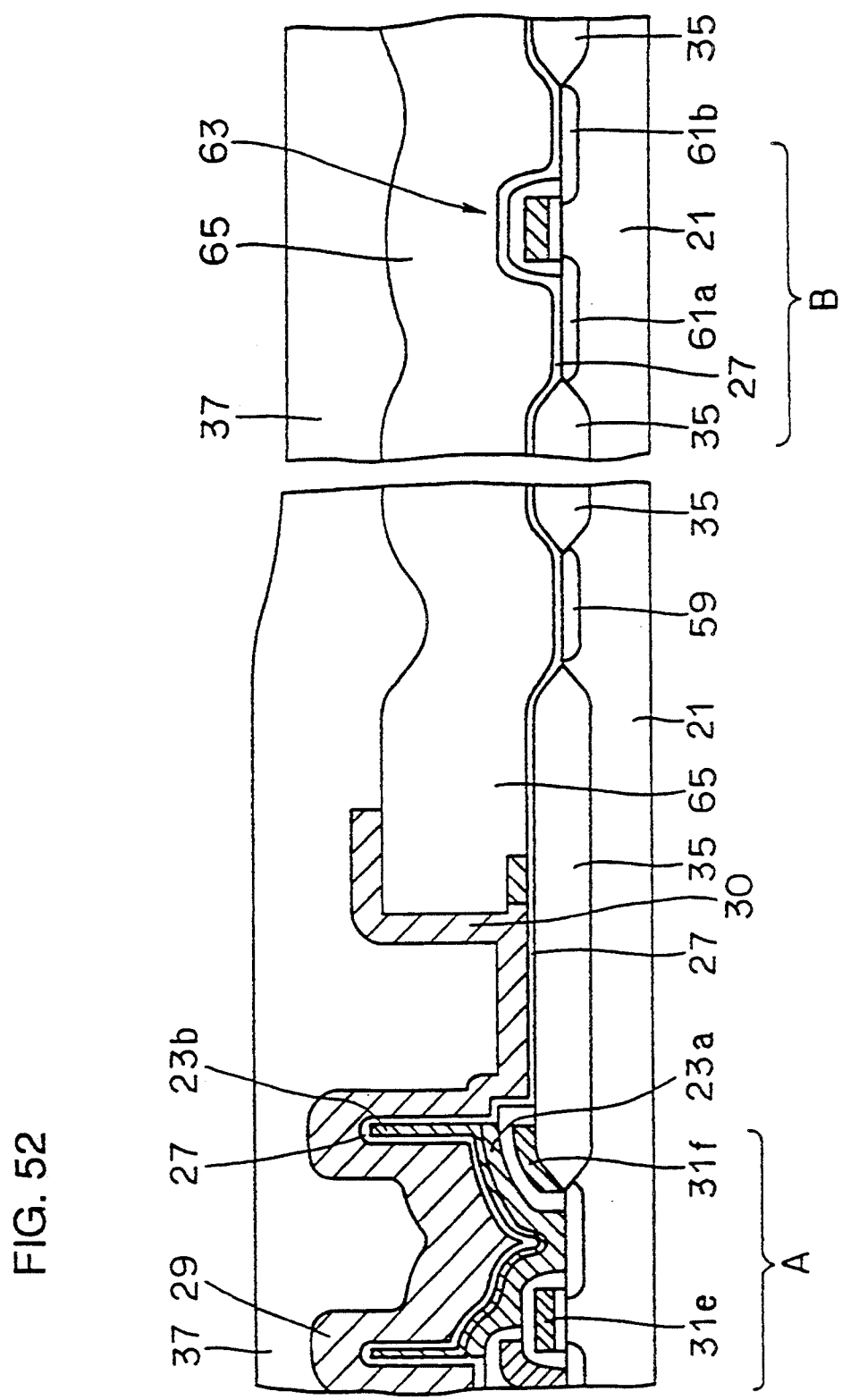
FIGS. 52-57 are sectional views showing the processing steps of an electrical connection method between a lower layer interconnection layer and an upper layer interconnection layer.
Figure 53:
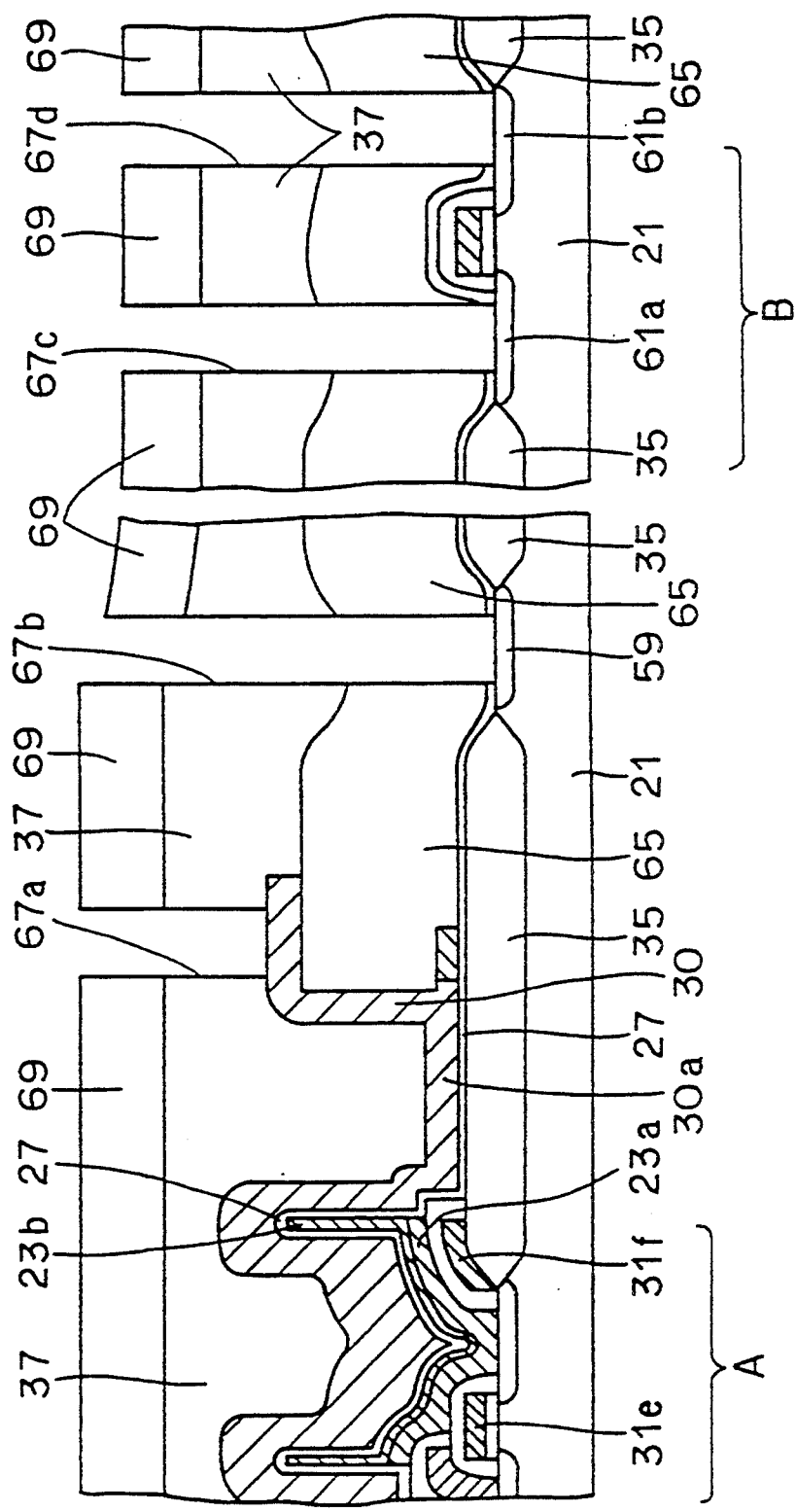
Figure 54:
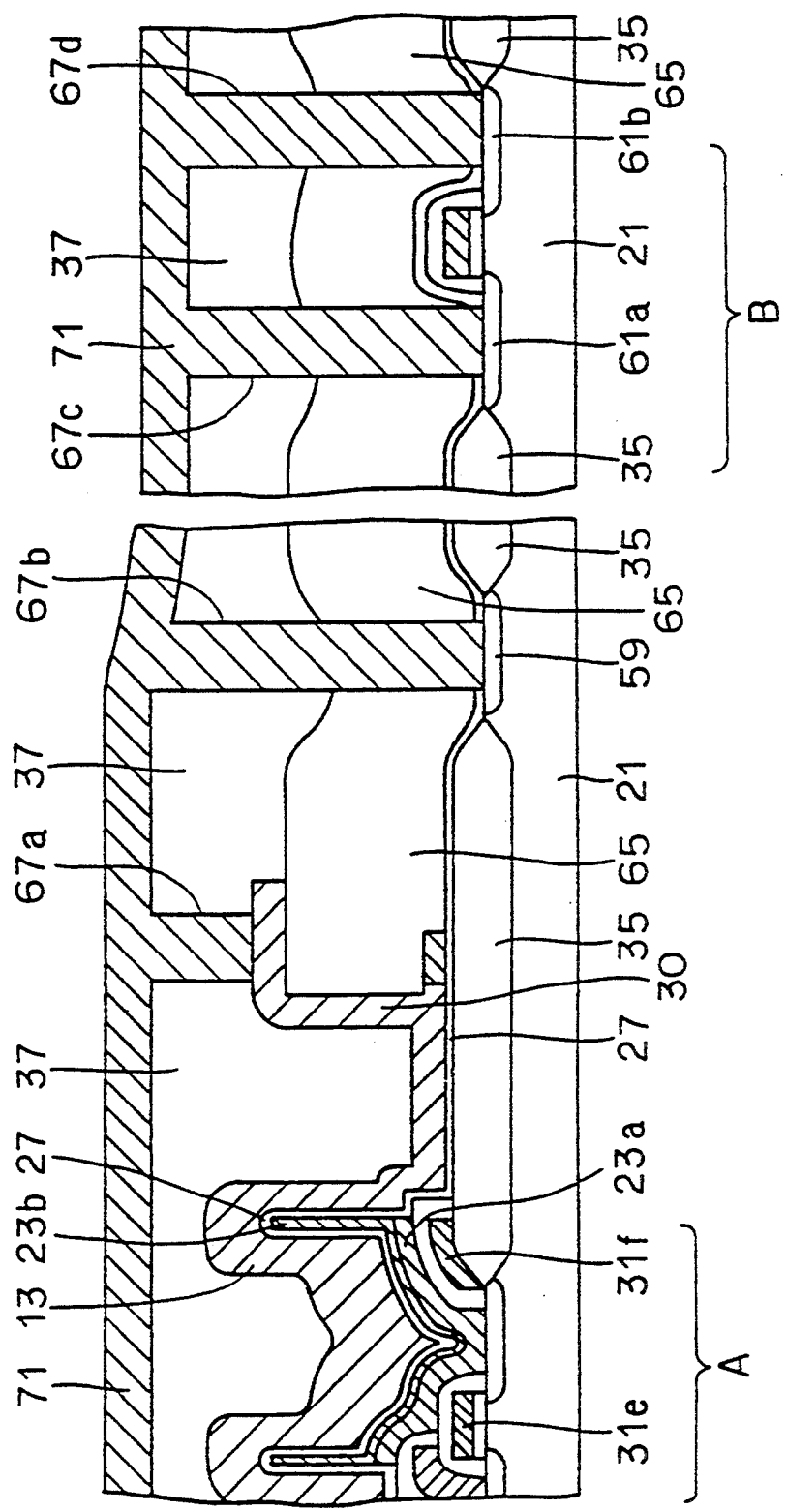
Figure 55:
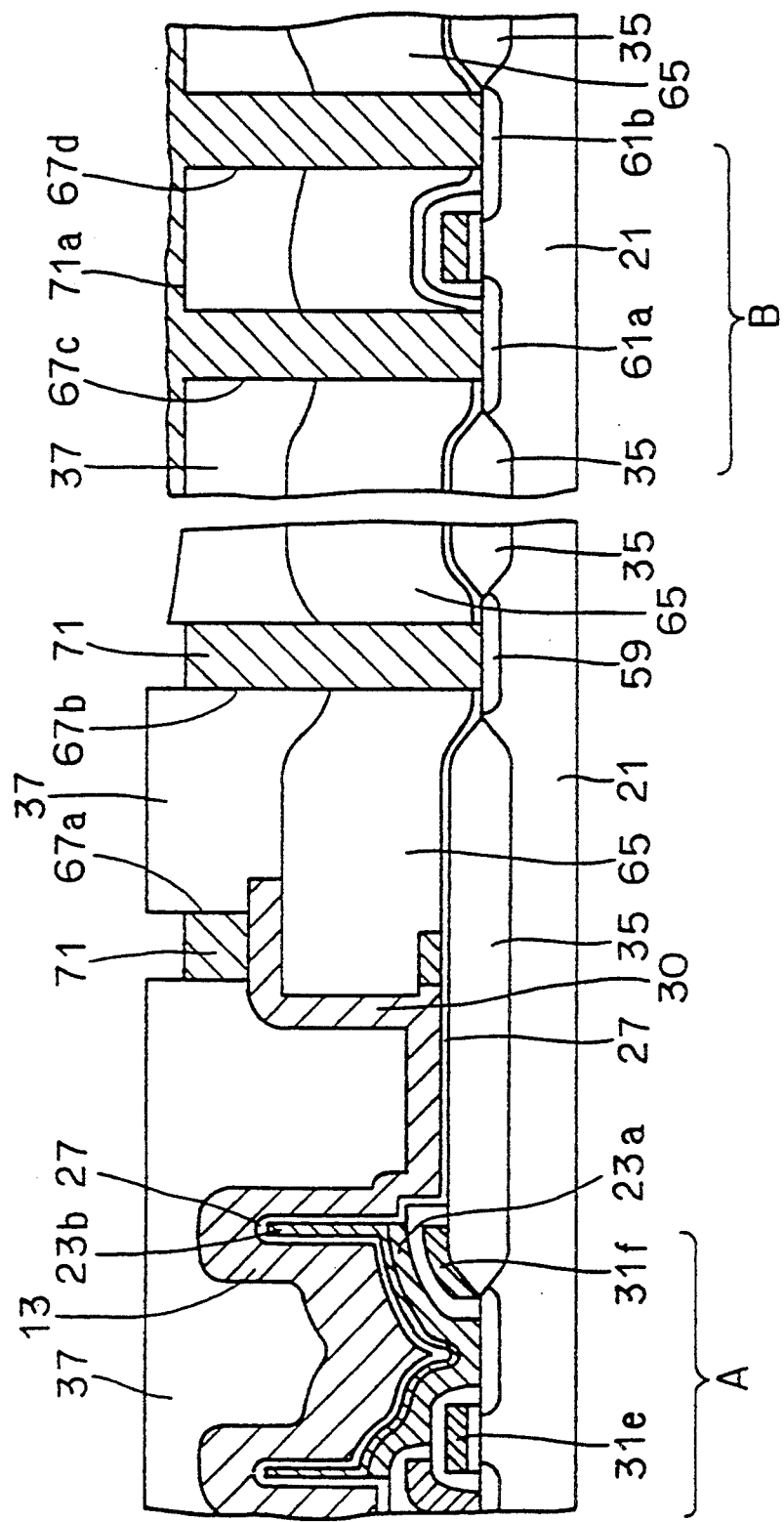
Figure 56:
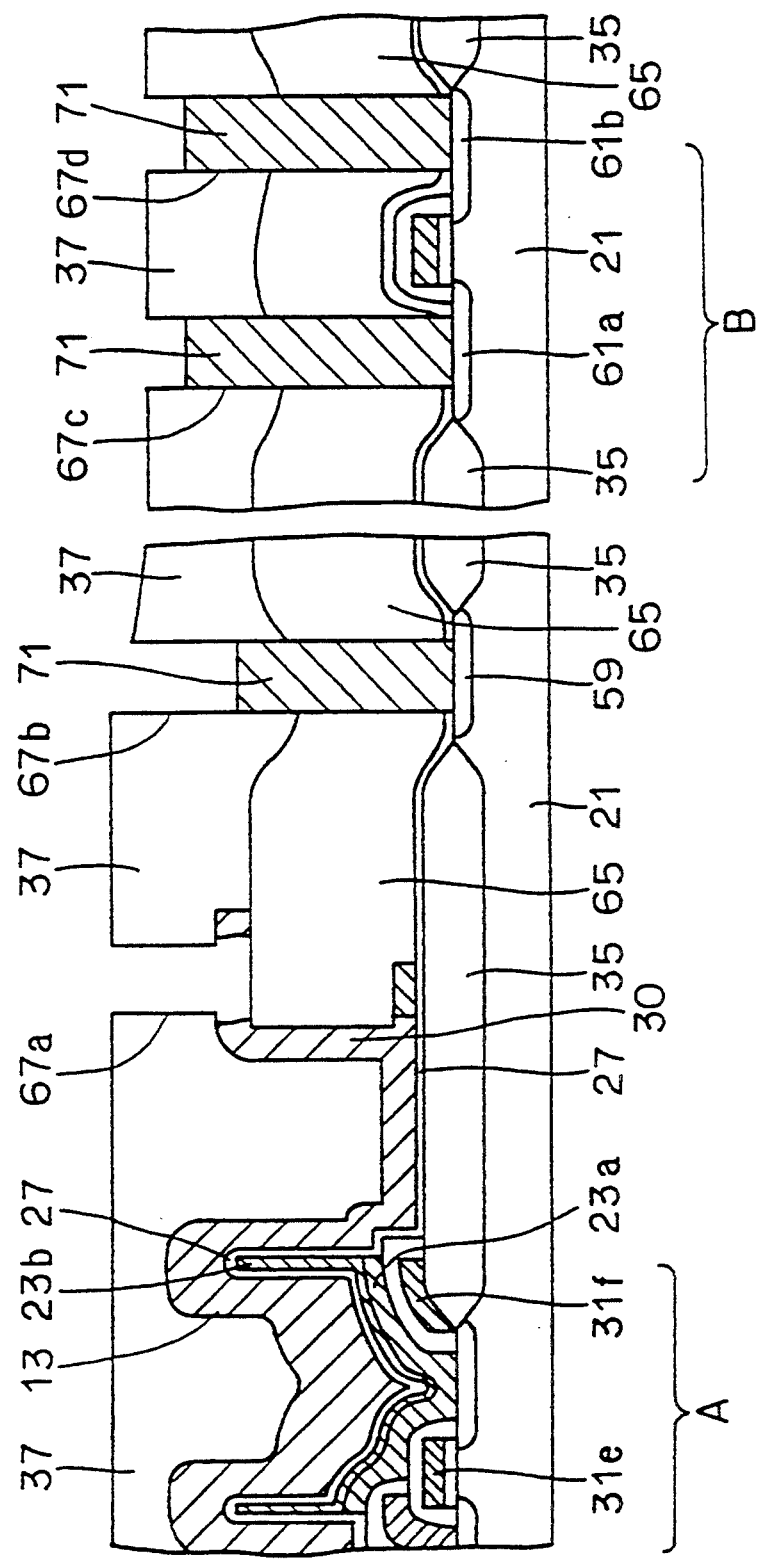
Figure 57:
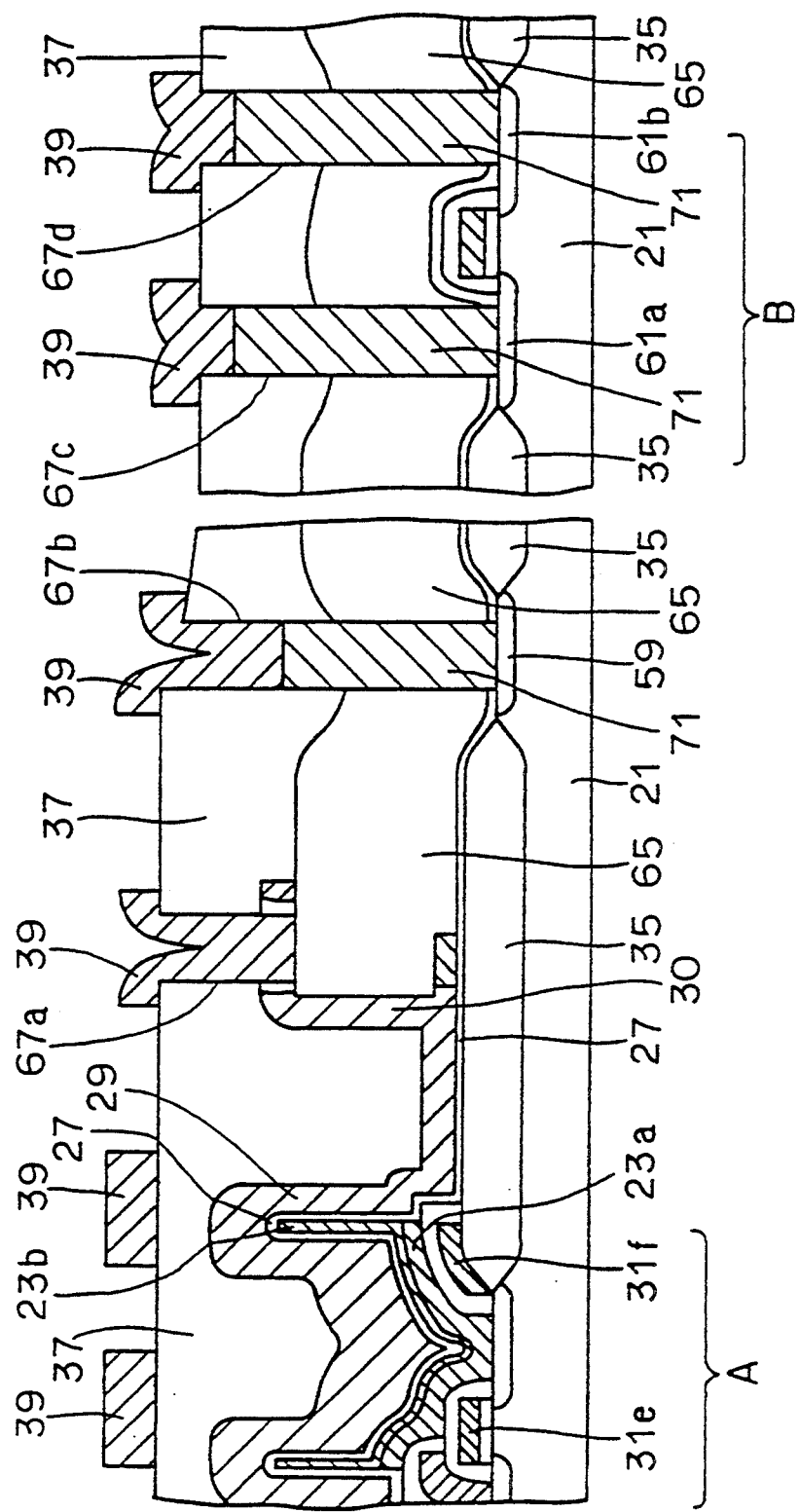

FIG. 33 is a sectional view of a semiconductor device according to a fourth embodiment of the present invention. The elements similar to those in the first embodiment of FIG. 1 have the same reference character denoted and their description will not be repeated. In comparison with the first embodiment where field oxide film 107a resides beneath through hole 95a, a field oxide film is not present beneath through hole 95a in the fourth embodiment as shown in FIG. 33.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory cell formation region in which a memory cell is formed on a semiconductor substrate having a main surface, an impurity region formed on said main surface, a storage node having a node surface and formed to be electrically connected to said impurity region and having a portion extending upwards with respect to said main surface, a dielectric film having a dielectric surface and formed on the node surface of said storage node, a cell plate formed on the dielectric surface of said dielectric film,
a first interlayer insulating film having an upper face portion and formed on said main surface substantially laterally spaced from said memory cell formation region,
a lower interconnection layer formed substantially laterally between said memory cell formation region and said first interlayer insulating film, and said lower interconnection layer comprising a portion of said cell plate,
a second interlayer insulating film formed substantially laterally between said memory cell formation region and said first interlayer insulating film, and having a through hole exposing said lower interconnection layer, and
an upper interconnection layer formed on said second interlayer insulating film, and electrically connected to said lower interconnection layer via said through hole,
wherein said lower and upper interconnection layers and said second interlayer insulating film are positioned substantially laterally between said memory cell formation region and said first interlayer insulating film.

2. The semiconductor memory device according to claim 1, wherein said lower interconnection layer has a concave shape,
wherein said through hole reaches the bottom of said concave shape of the lower interconnection layer.

3. The semiconductor memory device according to claim 1, wherein said lower interconnection layer extends upon said first interlayer insulating layer.

4. The semiconductor memory device according to claim 1, wherein the depth of said through hole is at least 5000 Å.

5. The semiconductor memory device according to claim 1, wherein an element isolation insulating layer is positioned below said through hole.

6. The semiconductor memory device according to claim 2, wherein the length of the bottom of said concave shape of the lower interconnection layer is at least 1.0 μm and at most 3.0 μm.

7. A semiconductor memory device, comprising:
a memory cell formation region including
a substrate with a main surface, the main surface including first and second main surface portions;
an impurity region formed on the first main surface portion;
a storage node having wall and base portions, the base portion formed on said impurity region;
a dielectric film formed on said storage node; and
a cell plate formed on said dielectric film;
a first insulating film formed on the second main surface portion substantially laterally spaced from said first main surface;
a lower interconnection layer formed substantially laterally between said memory cell formation region and said first insulating film, said lower interconnection layer comprising a portion of said cell plate;
a second insulating film formed substantially laterally between said memory cell formation region and said first insulating film, and having a through hole exposing said lower interconnection layer; and
an upper interconnection layer formed on said second insulating film, and electrically connected to said lower interconnection layer via said through hole.

8. The semiconductor memory device according to claim 7, wherein said lower and upper interconnection layers and said second insulating film are positioned between said memory cell formation region and said first insulating film.

9. The semiconductor memory device according to claim 7, wherein said dielectric layer prevents substantial conductance of electricity between said upper interconnection layer and said impurity region.

10. The semiconductor memory device according to claim 7, wherein said dielectric layer is interposed between said upper interconnection layer and said impurity region.

11. The semiconductor memory device according to claim 7, wherein said lower interconnection layer covers a plurality of memory cells disposed on the substrate.

12. The semiconductor memory device according to claim 7, wherein said lower interconnection layer is continuous over a plurality of memory cells disposed on the substrate.

13. The semiconductor memory device according to claim 7, wherein the through hole in said lower interconnection layer is formed outside the memory cell formation region.

* * * * *